United States Patent
Stephens, Jr.

(10) Patent No.: US 9,304,525 B1
(45) Date of Patent: Apr. 5, 2016

(54) REFERENCE LEVEL ADJUSTMENT FOR CALIBRATION OF DUAL-GATE TRANSISTORS

(71) Applicant: Michael C. Stephens, Jr., Los Gatos, CA (US)

(72) Inventor: Michael C. Stephens, Jr., Los Gatos, CA (US)

( * ) Notice: Subject to any disclaimer, the term of this patent is extended or adjusted under 35 U.S.C. 154(b) by 0 days.

(21) Appl. No.: 14/668,643

(22) Filed: Mar. 25, 2015

Related U.S. Application Data

(60) Provisional application No. 62/126,954, filed on Mar. 2, 2015.

(51) Int. Cl.
  *G05F 1/46* (2006.01)
(52) U.S. Cl.
  CPC ...................................... *G05F 1/468* (2013.01)
(58) Field of Classification Search
  CPC .............................. G05F 1/468; H03K 17/063
  See application file for complete search history.

(56) References Cited

U.S. PATENT DOCUMENTS

| | | | |
|---|---|---|---|
| 5,377,155 A | 12/1994 | Tamaki et al. | |
| 5,463,584 A | 10/1995 | Hoshino | |
| 5,639,680 A * | 6/1997 | Hoeld | H01L 27/0623 257/E27.015 |
| 5,650,968 A | 7/1997 | Dosaka et al. | |
| 5,654,916 A | 8/1997 | Sato et al. | |
| 5,819,305 A | 10/1998 | Nixon | |
| 6,492,860 B1 * | 12/2002 | Ramakrishnan | H03K 17/162 327/404 |
| 6,911,860 B1 * | 6/2005 | Wang | H03K 3/356113 327/333 |
| 8,049,214 B2 | 11/2011 | Marshall | |
| 9,094,008 B2 * | 7/2015 | Lee | H03K 17/102 |
| 2016/0043712 A1 * | 2/2016 | Okuda | H03K 17/14 327/382 |

OTHER PUBLICATIONS

Yildiz Sinangil, et al., "A 128 Kbit SRAM With an Embedded Energy Monitoring Circuit and Sense-Amplifier Offset Compensation Using Body Biasing," IEEE Journal of Solid-State Circuits, vol. 49, No. 11, Nov. 2014, pp. 2730-2739.

* cited by examiner

*Primary Examiner* — Jung Kim

(57) ABSTRACT

Disclosed are various embodiments related to dual-gate transistors and associated calibration circuitry. In one embodiment, dual-gate transistors may be configured in a sense amplifier arrangement, and calibration circuitry can be used to adjust an input offset of the sense amplifier. In another embodiment, a reference level voltage utilized in an amplifier with dual-gate transistors can be adjusted during a calibration sequence, and may be substantially unchanged from its nominal value outside of the calibration sequence. In another embodiment, a calibration sequence can be utilized to determine circuit results from a circuit including dual-gate transistors, and to adjust control gates to more closely coincide with expected or desired results. In yet another embodiment, a semiconductor memory device can include a memory array with amplifiers that include dual-gate transistors, as well as associated calibration circuitry.

12 Claims, 16 Drawing Sheets

REFERENCE LEVEL ADJUSTMENT FOR CALIBRATION OF DUAL-GATE TRANSISTORS

CROSS REFERENCES TO RELATED APPLICATIONS

This application claims priority from U.S. Provisional Patent Application Ser. No. 62/126,954, filed on Mar. 2, 2015, which is hereby incorporated by reference as if set forth in full in this application for all purposes.

FIELD OF THE INVENTION

The present invention generally relates to the field of semiconductor devices, and more particularly, to dual-gate transistors and associated calibration circuitry.

BACKGROUND

A multi-late device or multiple gate field-effect transistor (MuGFET) may be a metal oxide semiconductor field-effect transistor (MOSFET) that incorporates more than one gate into a single device. Examples of multigate devices include FinFETs. Flexfets, tri-gate transistors, and gate-all-around (GAA) FETs. The multiple gates ma be independently controlled, or may electrically act as a single gate in some cases. For independently controlled dual gate transistors, one gate may be considered a control gate and the other gate may be considered a signal gate, whereby a voltage on the control gate can affect the threshold voltage of the transistor.

DETAILED DESCRIPTION OF EMBODIMENTS

Figure 1:
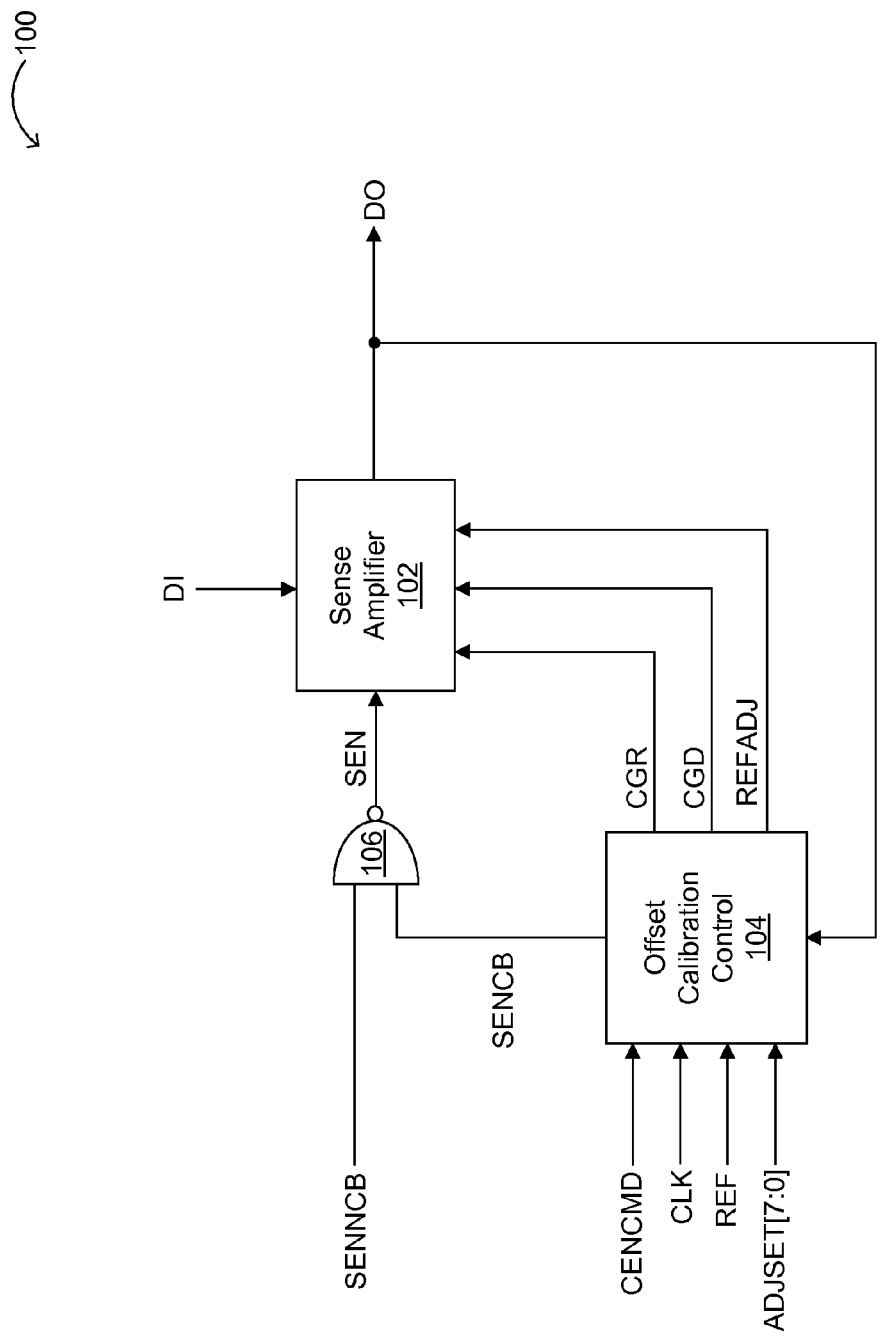
FIG. 1 is a schematic block diagram showing an example amplifier and calibration control arrangement, in accordance with embodiments of the present invention.

Reference will now be made in detail to particular embodiments of the invention, examples of which are illustrated in the accompanying drawings. While the invention will be described in conjunction with particular embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, etc. have not been described in detail so as not to unnecessarily obscure aspects of the present invention.

Some portions of the detailed descriptions which follow are presented in terms of processes, procedures, block arrangements, logic blocks, functional blocks, processing, circuit schematics, and/or other symbolic representations of operations or device arrangements. These descriptions and representations are generally used by those skilled in the relevant arts to effectively convey the substance of their work to others skilled in the art.

Particular embodiments can advantageously provide circuits, methods, and structures, to facilitate circuit operation, or to otherwise modify circuit operation, for circuits including multigate (e.g., FinFET) devices. For example, particular embodiments can advantageously provide approaches that allow for calibration or adjustment of operation for dual-gate transistors, such as in a sense amplifier or input receiver configuration. Various embodiments relate to any type of transistor having at least one control gate and at least one signal gate, whereby a voltage on the control gate can be used to affect a threshold voltage of the transistor. For example, an increased control gate voltage for an NMOS FinFET can reduce the transistor threshold voltage, while a decreased control gate voltage for a PMOS FinFET can reduce that threshold voltage.

In one embodiment, dual-gate transistors may be configured in a sense amplifier arrangement, and calibration circuitry can be used to adjust an input offset of the sense amplifier. In another embodiment, a reference level voltage utilized in an amplifier with dual-gate transistors can be adjusted during a calibration sequence, and may be substantially unchanged from its nominal value outside of the calibration sequence. In another embodiment, a calibration sequence can be utilized to determine circuit results from a circuit including dual-gate transistors, and to adjust control gates to more closely coincide with expected or desired results. In yet another embodiment, a semiconductor memory device can include a memory array with amplifiers that include dual-gate transistors, as well as associated calibration circuitry. These and various other embodiments will be discussed in more detail below.

Particular embodiments are suited to chips or devices that include multigate, such as dual-gate (e.g., FinFET), transistors arranged in circuitry whereby matching (or mismatching) of various circuit attributes can result in different circuit behavior. For example, input offset and transistor behavior matching problems, particularly at lower voltages and with increasingly smaller device geometries, can cause inconsistent or incorrect circuit operation. In particular embodiments, such matching problems can be addressed by "calibration" circuitry whereby the circuit can be tested from each "side" or expected output state, in order to determine a calibration result that can mitigate potential matching problems. In some cases, a deliberate skew can be introduced into a circuit in order to favor one result or expected output over another. Further, the calibration result can be effectively applied to control gates, such as those of dual-gate transistors in the circuitry utilizing matching or otherwise coupled devices. In this way, multigate transistor based circuitry may be suitable for high-volume manufacturing in advanced process techniques, and also can accommodate lower operating voltages.

Of course, while dual-gate FinFET devices are primarily used in the examples herein, any suitable multigate transistor or device can be employed. In particular, any type of transistor whereby a threshold voltage can be controlled or adjusted by one of the transistor gates (e.g., a control gate) can be utilized. In addition, while differential and sense amplifiers are exemplified herein, any type of amplifying or matching (e.g., current mirror) circuitry can be employed in certain embodiments. Further, as used herein "calibration" can refer to an adjustment or potential adjustment resulting from calibration circuits that aim to improve or to otherwise adjust a particular characteristic or likely output of a circuit having matched or otherwise related multigate devices. In addition, a "calibration sequence" can refer to a series of cycles (e.g., as defined by a clock), including "phases" or portions of the calibration sequence, in which calibration settings are determined. Also, "side" as used herein may indicate that the calibration is done by considering each side, or way the circuit having matched multigate devices may operate, such as each expected output state (e.g., an amplifier that outputs a logic 1 or a logic 0 based on the amplifier inputs).

In particular embodiments, dual-gate transistors may be configured in a sense amplifier arrangement, and calibration circuitry can be used to adjust an input offset of the sense amplifier. In one embodiment, a semiconductor device can include: (i) a first dual-gate transistor having a signal gate coupled to a first data input, and a control gate coupled to a first control signal; (ii) a second dual-gate transistor having a signal gate coupled to a second data input, and a control gate coupled to a second control signal, where the first and second dual-gate transistors are arranged in an amplifier configuration; and (iii) a calibration circuit configured to adjust the first and second control signals when enabled, and to maintain the first and second control signals when disabled.

Referring now to FIG. 1, shown is a schematic block diagram of an example amplifier and calibration control arrangement, in accordance with embodiments of the present invention. In example 100, sense amplifier 102 can receive data input (DI), such as from a memory array (e.g., DRAM, SRAM, etc.). Offset calibration control 104 can receive a calibration enable command signal (CENCMD), a clock signal (CLK), a reference voltage level (REF), and adjustment setting signals (ADJSET[7:0]), as well as data output (DO) from sense amplifier 102. Offset calibration control 104 can provide control gate signals (CGR, CGD) and an adjusted reference level (REFADJ) to sense amplifier 102. In addition, a non-calibration sense amplifier enable signal (SENNCB) can be input to NAND-gate 106 along with calibration sequence sense amplifier enable signal (SENCB), such that a sense amplifier enable signal (SEN) can be output from NAND-gate 106. Thus, sense amplifier 102 can be enabled either for normal (e.g., memory cell data reading) operations, or for a calibration operation as described herein.

Figure 2:
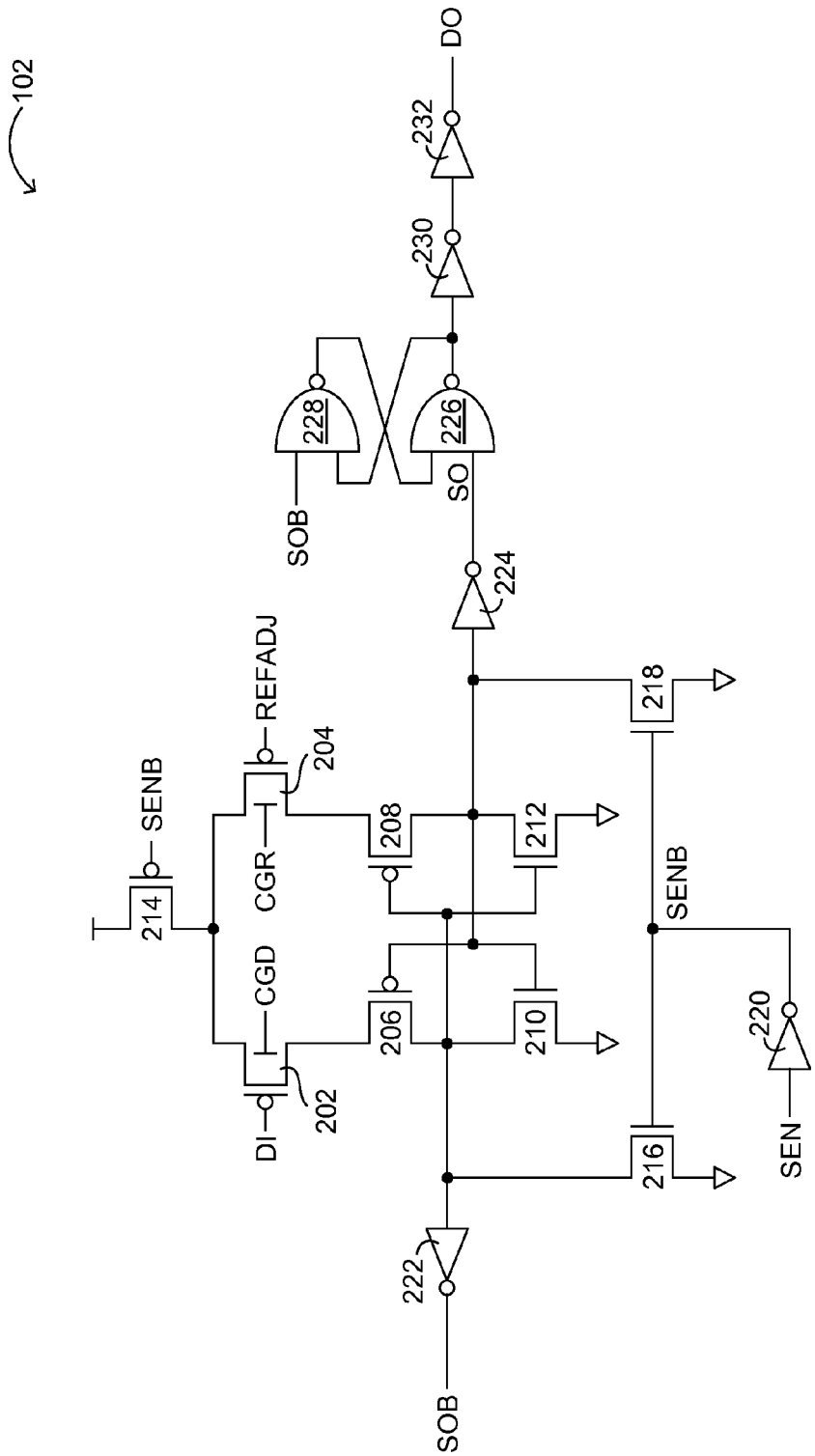
FIG. 2 is a schematic block diagram showing an example amplifier circuit with dual-gate transistors, in accordance with embodiments of the present invention.

Referring now to FIG. 2, shown is a schematic block diagram of an example amplifier circuit 102 with dual-gate transistors, in accordance with embodiments of the present invention. For example, transistors 202 and 204 can be FinFETs with independent control and signal gates. Dual-gate PMOS transistor 202 can receive the data input at a signal gate thereof, and control signal CGD can connect to a control gate thereof. Also, dual-gate PMOS transistor 204 in a matching configuration in this case can receive adjusted reference level REFADJ at a signal gate thereof, and control signal CGR can connect to a control gate thereof. Cross-coupled inverter structures including PMOS transistors 206 and 208 and NMOS transistors 210 and 212 can form a sense amplifier arrangement.

Sense amplifier 102 can be enabled based on sense amplifier enable signal SEN, which can be inverted via inverter 220 to form an active low enable signal SENB. Active low enable signal SENB can connect to gates of PMOS transistor 214, NMOS transistor 216, and NMOS transistor 218. Thus, when sense amplifier enable signal SEN is high, either due to an enabled calibration sequence or when in normal operation during a non-calibration sequence, sense amplifier 102 can sense and amplify a difference on data input DI as compared to adjusted reference level REFADJ. As will be discussed in more detail below, adjusted reference level REFADJ can be the same, or substantially the same as, a normal or a nominal reference level REF when not in a calibration mode.

As described herein, data input DI can be held low (e.g., at ground or 0V) during a calibration sequence, and adjusted reference level REFADJ can be increased (e.g., by VADJ during a phase 1 of the calibration sequence) and then decreased (e.g., by VADJ during a phase 2 of the calibration sequence). Thus, adjusted reference level REFADJ can be controlled to be greater than or less than the corresponding data input, such as by a value of VADJ. However, data input DI, while being held at a low level in many of the examples described herein, may also be any other voltage level, such as an intermediate (e.g., half of the supply voltage) voltage level. In such a case, that intermediate level can be considered as a nominal reference level, and adjusted reference level REFADJ can be controlled to be greater than or less than that nominal reference level.

In this way, particular embodiments can accommodate any suitable array structure by controlling the adjusted reference level with respect to a nominal reference level. Further, the low level on data input DI may be a suitable level if corresponds to a default storage level in associated memory cells or other data being amplified. That is, the calibration sequence may be applied as part of a power up or initialization operation whereby the default levels to be amplified can be considered, and the adjusted reference level can be adjusted with respect to those default levels as represented by data input DI. By accommodating the default data state associated with data input DI, the calibration sequence can be simplified because actual access of the memory cell or associated circuitry may not be necessary.

However, in other cases, and may be desirable to access the memory cell or associated circuitry, and to use that state as part of the calibration process. For example, in such an approach the adjusted reference level REFADJ may be substantially fixed, but based on the data pattern employed and accessed via data input DI, the calibration sequence as described herein can still be carried out. Thus, either one of the signal gates for dual-gate transistors 202 and 204 can be substantially fixed, while the other is adjusted (e.g., by increasing or decreasing by an adjustment voltage) in order to carry out the calibration sequence. In any event, particular embodiments are suitable to a wide variety of memory array, circuitry, and associated data structures by way of data input and adjusted reference level manipulation during a calibration sequence.

The sense amplifier output signal can be developed on the nodes that are input to inverters 222 and 224, thus producing sense amplifier output signals as SOB and SO, respectively. In this particular example, signals can then be input to the SR flip-flop formed by NAND-gates 226 and 228. The output of the SR flip-flop can be provided to buffers 230 and 232 to generate data output DO. In other cases, the SR flip-flop structure may not be utilized, and data direct from sense amplifier output signal SO can be buffered to provide data output DO. In certain embodiments, a calibration sequence can be employed to determine settings on control signals CGD and CGR in order to provide better matching characteristics, such as substantially negated input offset effects on operation of sense amplifier 102.

In certain embodiments, the calibration sequence can be employed to determine settings on control signals CGD and CGR in order to modify circuit operation, such as by providing an intentional skew to favor one side or the other. Thus, the calibration sequence need not be used merely to improve aspects of circuit operation, such as reduction of input offset. Rather, any circuit characteristic, and particularly those affected by threshold voltage modification via a control gate of a dual-gate transistor, can be modified via the calibration sequence. Further, while a specific sense amplifier arrangement and associated circuit is shown in this particular example, certain embodiments can accommodate any suitable type of amplifier or circuit structure that includes dual-gate transistors. Further, transistors other than 202 and 204 may also be dual-gate transistors consistent with a particular process technology. For example, all transistors may be formed in a FinFET process technology, and transistors other than 202 and 204 may be operated such that their control and signal gates are connected together.

Figure 3:
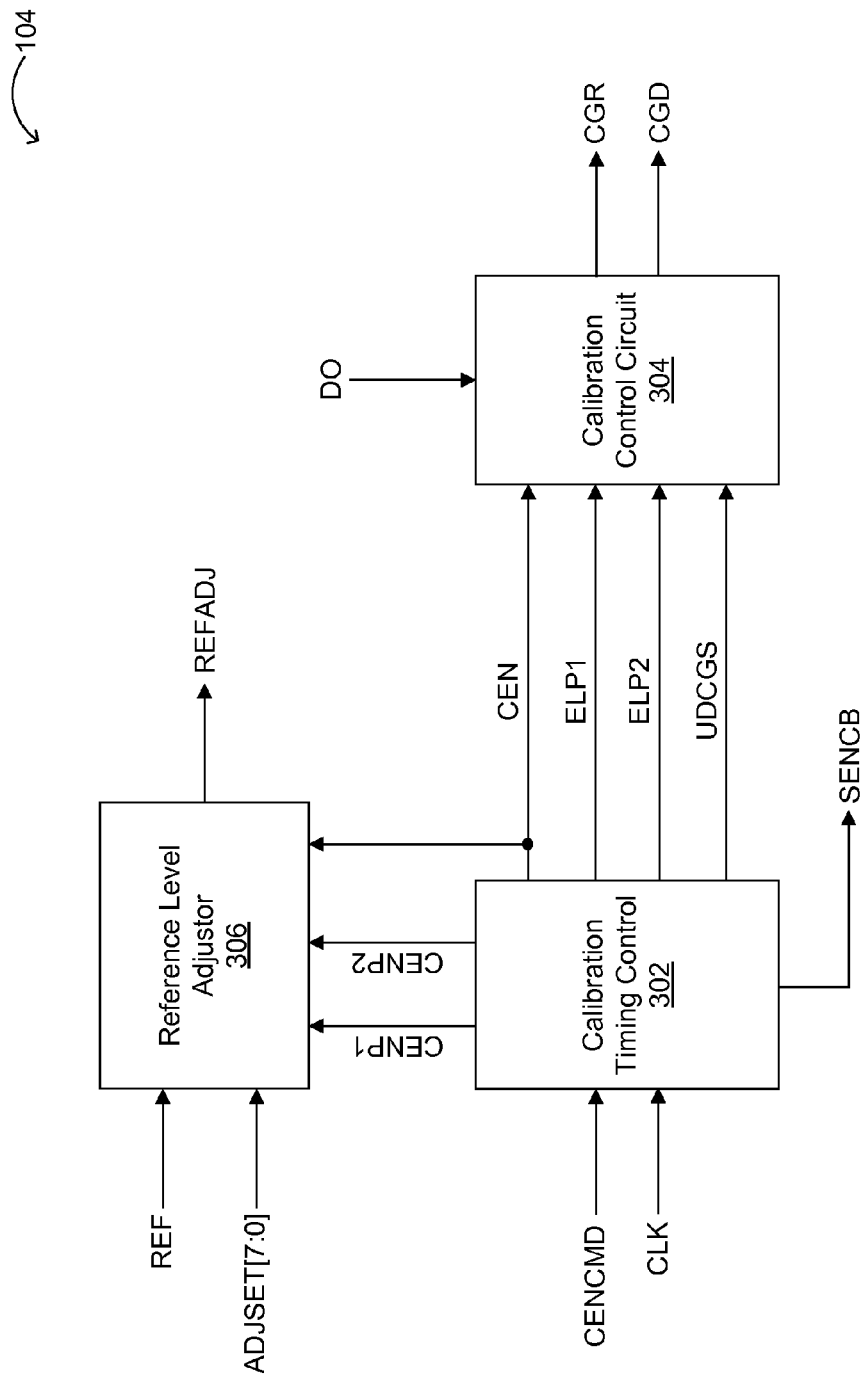
FIG. 3 is a schematic block diagram showing an example calibration controller, in accordance with embodiments of the present invention.

Referring now to FIG. 3, shown is a schematic block diagram of an example calibration controller, in accordance with embodiments of the present invention. Offset calibration control 104 can include calibration timing control 302, calibration control circuit 304, and reference level adjuster 306. Calibration timing control 302 can generate various timing signals utilised by other circuits in the calibration sequence or process. For example, calibration timing control 302 can receive calibration enable command signal CENCMD and clock signal CLK, and may generate a calibration enable signal (CEN), a calibration enable for "phase 1" of the calibration sequence signal (CENP1), a calibration enable for "phase 2" of the calibration sequence signal (CENP2), an enable latch control signal for phase 1 (ELP1), an enable latch control signal for phase 2 (ELP2), an update control gate signal pulse (UDCGS), and calibration sequence sense amplifier enable signal SENCB.

Calibration control circuit 304 can receive calibration enable signal CEN, phase 1 enable latch control signal ELP1, phase 2 enable latch control signal ELP2, update control gate signal pulse UDCGS, and data output signal DO from sense amplifier 102, and may generate control signals CGR and CGD for the control gates of transistors 202 and 204 in sense amplifier 102. Reference level adjuster 306 can receive reference level REF, adjustment setting signals ADJSET[7:0], calibration enable signal CEN, phase 1 calibration enable signal CENP1, and phase 2 calibration enable signal CENP2, and may generate adjusted reference level REFADJ.

Adjustment setting signals ADJSET[7:0] can be any inputs used for adjusting the reference level, and may be dynamically input via address pins or other signals that are coupled to external chip circuitry. In some cases, the adjustment setting signals can be modified from one calibration sequence to the next, such as when corresponding to one portion of a memory array versus another, or one type of circuitry versus another. As will be discussed in more detail below, phase calibration enable signals CENP1 and CENP2 can be used to control when adjusted reference level REFADJ is an increased or decreased voltage relative to reference level, in order to effectively test both sides of sense amplifier 102.

Figure 4:
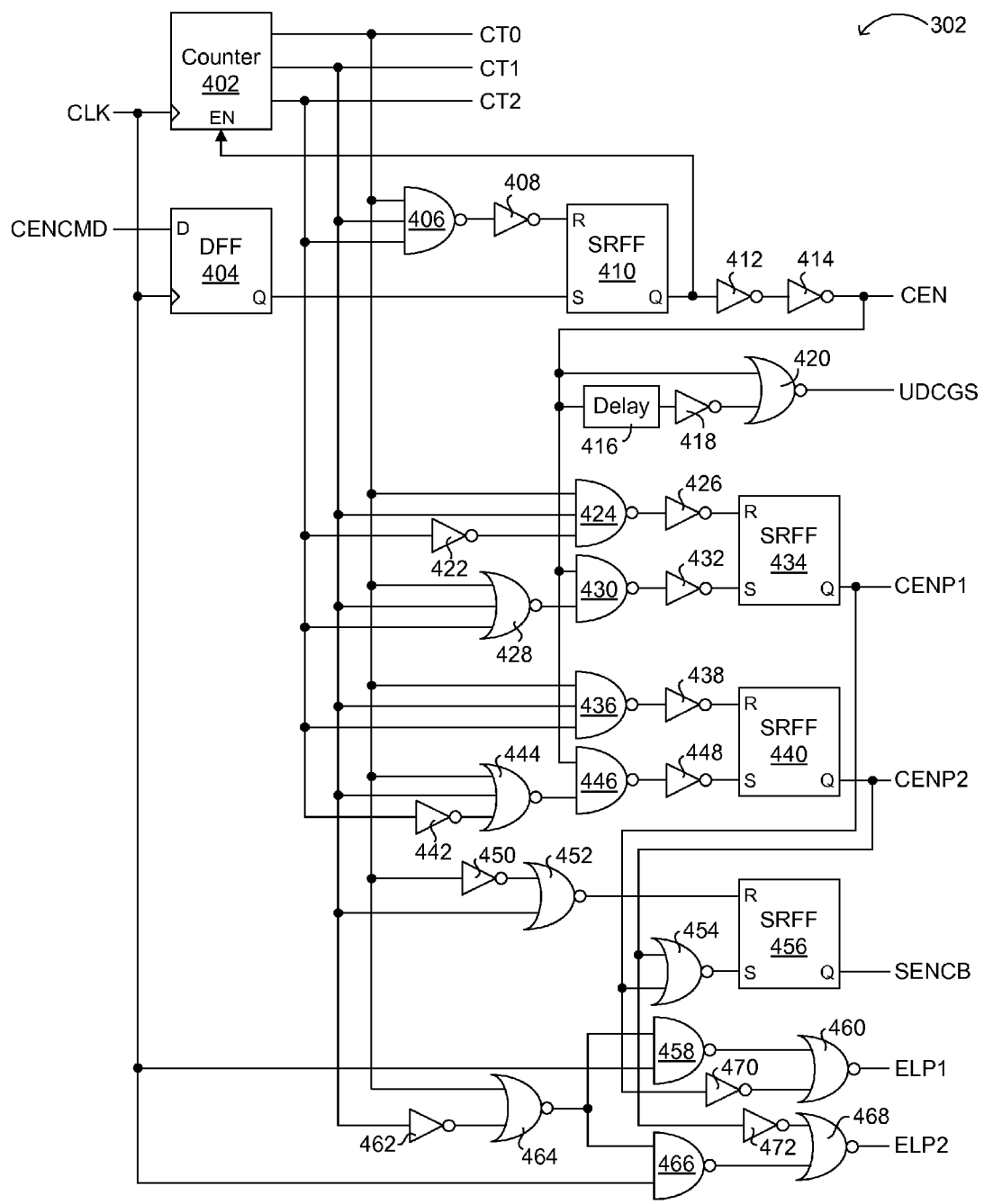
FIG. 4 is a schematic block diagram showing an example calibration timing control circuit, in accordance with embodiments of the present invention.

Referring now to FIG. 4, shown is a schematic block diagram of an example calibration timing control circuit, in accordance with embodiments of the present invention. Calibration timing control circuit 302 can include counter 402, which can generate count signals CT0, CT1, and CT2 when enabled, and may be based on rising edges of the clock signal. For example, the count signals can count 8 cycles for each calibration sequence activation that is initiated via the CENCMD signal, as input to D-type flip-flop 404. Thus, a detected activation of CENCMD by DFF 404 can be used as the set input to SR flip-flop 410, the output of which can be buffered by inverters 412 and 414 to generate calibration enable signal CEN.

Calibration enable signal CEN can remain high for substantial portions of the calibration sequence. The reset of SR flip-flop 410, and thus calibration enable signal CEN, can occur when the count signal bits are all one, as determined by NAND-gate 406 and inverter 408. Thus, CEN can be activated upon an initial count cycle, and the activated upon a last count cycle, as shown in the example waveforms of FIG. 6. Of course, counters other than 3-bit counters can be employed as necessary for a given application. In some cases, the calibration sequence may take more clock cycles or fewer clock cycles, depending on the amplifier characteristics and a clock frequency, among other factors. In these cases, different types of counters 402 can be employed.

The update control signal UDCGS for the control gates of dual-gate transistors 202 and 204 can be generated as a one-shot or pulse signal upon a falling edge of calibration enable CEN. This pulse signal can be a duration substantially of delay circuit 416, an output of which can be inverted via inverter 418, and input to NOR-gate 420. NOR-gate 420 can thus provide a high going pulse signal upon a high to low transition of calibration enable signal CEN. In this way, the control signals connected to the control gates of dual-gate transistors 202 and 204 may only be updated upon the substantial completion of the calibration sequence. Also, these control signals CGR and CGD may be held low during the calibration enable signal activation time, and then allowed to update upon deactivation or completion of the calibration sequence. In other cases, the control signals CGR and CGD may be held to a different state (e.g., high) during the calibration sequence. In either case, the updated states of control signals CGR and CGD can occur upon completion of the calibration sequence.

The calibration sequence may generally be divided into 2 phases, each phase corresponding to testing of one side of the amplifier, or other matched circuit under consideration. Again referring to FIG. 4 in conjunction with FIG. 6, phase 1 calibration enable signal CENP1 can be activated via SR flip-flop 434 when the count signals are CT[2:0]=000 as detected by NOR-gate 428 and when calibration enable signal CEN is high, as determined via NAND-gate 430 and inverter 432. Phase 1 calibration enable signal CENP1 can be deactivated when CT[2:0]=011 and calibration enable CEN is high, as determined via inverter 422, NAND-gate 424, and inverter 426 having an output connected to the reset terminal of SR flip-flop 434. Phase 2 calibration enable signal CENP2 can be activated via SR flip-flop 440 when the count signals are CT[2:0]=100 as detected by inverter 442 and NOR-gate 444 and when calibration enable signal CEN is high, as determined via NAND-gate 446 and inverter 448. Phase 2 calibration enable signal CENP2 can be deactivated when CT[2:0]=111 and calibration enable CEN is high, as determined via NAND-gate 436, and inverter 438 having an output connected to the reset terminal of SR flip-flop 440.

Figure 6:
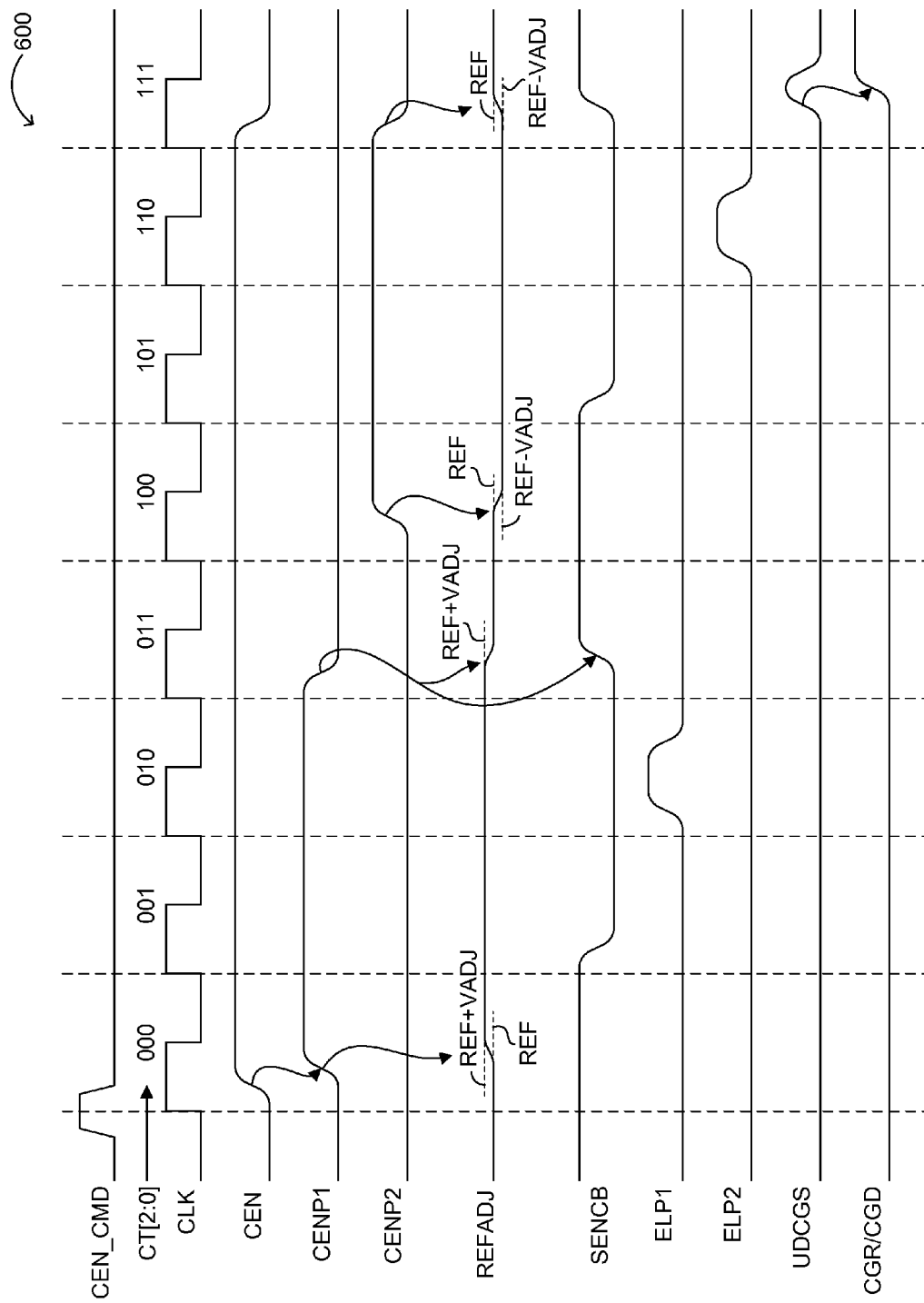
FIG. 6 is a waveform diagram showing an example calibration control operation, in accordance with embodiments of the present invention.

Sense amplifier enable for calibration signal SENCB can be an active low signal, which can be activated when CT[1:0]=01 by way of inverter 450 and NOR-gate 452. The output of NOR-gate 452 can connect to the reset terminal of SR flip-flop 456 for activating the sense amplifier during the calibration sequence. The amplifier can be disabled during the calibration sequence via NOR-gate 454, which can set SR flip-flop 456 to deactivate SENCB when phase calibration enable signals CENP1 and CENP2 are both low. Of course, depending upon how long it takes for suitable signal development to occur at the amplifier (or other circuit under consideration) outputs, the timing of enable signal SENCB can be different. For example, the timing of activation of signal SENCB can be more or less than the 2 clock cycles as shown in FIG. 6.

The enable latch control signals for phase 1 (ELP1) and phase 2 (ELP2) can be activated during a count cycle as CT[1:0]=10, as detected by inverter 462 and NOR-gate 464. These enable latch control signals can be about a duration of a high level of CLK, which can be input to NAND-gates 458 and 466. The other input of NAND-gates 458 and 466 can be the output from NOR-gate 464, which may indicate or align with the proper clock cycle in the calibration count sequence based on the count signals. Phase 1 enable latch control signal ELP1 can be activated when phase calibration enable signal CENP1 is high, and may be generated via NOR-gate 460, which also receives an output from NAND-gate 458 and an inverted version of CENP1 via inverter 470. Phase 2 enable latch control signal ELP2 can be activated when phase calibration enable signal CENP2 is high, and may be generated via NOR-gate 468, which also receives an output from NAND-gate 466 and an inverted version of CENP2 via inverter 472.

Figure 5:
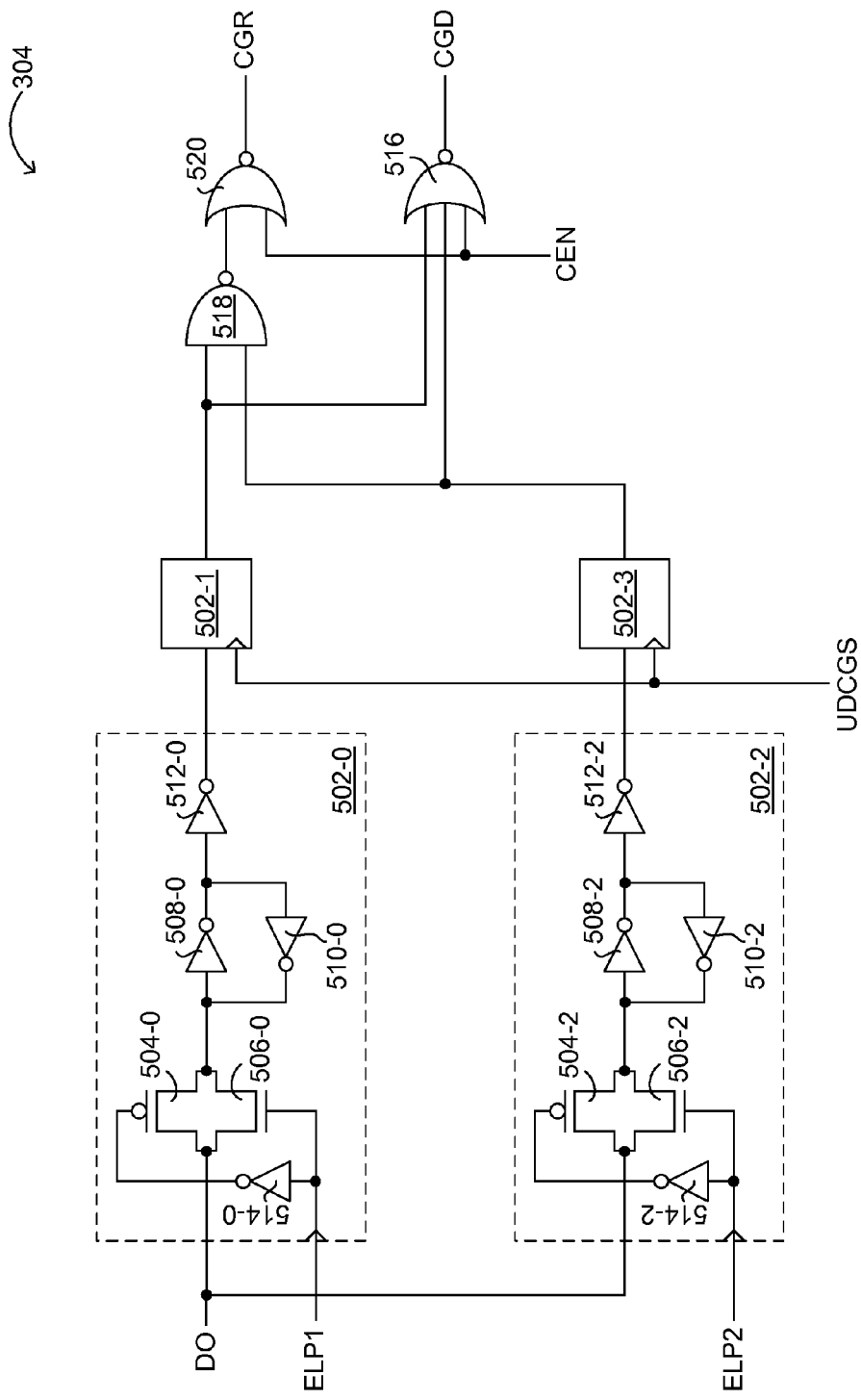
FIG. 5 is a schematic block diagram showing an example calibration control circuit, in accordance with embodiments of the present invention.

Referring now to FIG. 5, shown is a schematic block diagram of an example calibration control circuit, in accordance with embodiments of the present invention. Calibration control circuit 304 can include latch circuits 502 (e.g., 502-0, 502-1, 502-2, and 502-3). Phase 1 enable latch control signal ELP1 can be used to control opening/closing of the transmission gate in latch circuit 502-0. Thus, when ELP1 is high, NMOS transistor 506-0 can be turned on, and PMOS transistor 504-0 can also be turned on via inverter 514-0, to allow the data output from the sense amplifier to be captured in latch 502-0 as a first phase result. Once enable latch control signal ELP1 goes low to turn off the transmission gate, this first phase result can be held via inverters 508-0 and 510-0, and may be buffered via inverter 512-0.

Similarly, phase 2 enable latch control signal ELP2 can be used to open the transmission gate in latch circuit 502-2. Thus, when ELP2 is high, NMOS transistor 506-2 can be turned on, and PMOS transistor 504-2 can also be turned on via inverter 514-2, to allow the data output from the sense amplifier to be captured in latch 502-2 as a second phase result. Once enable latch control signal ELP2 goes low to turn off the transmission gate, this second phase result can be held via inverters 508-2 and 510-2, and may be buffered via inverter 512-2. In order to maintain the states of control signals CGR and CGD until the end of the calibration sequence, latch circuit 502-1 can be employed to allow the first result to pass through only when update control signal UDCGS is pulsed high. Similarly, latch circuit 502-3 can be utilized to allow the second result to pass through only when update control signal UDCGS is pulsed high.

During the calibration sequence, as indicated by calibration enable signal CEN being high, NOR-gates 520 and 516 can be used to keep control signals CGR and CGD low. These control signals may be held to a same (e.g., low level) until the calibration sequence is complete. Alternatively, control signal CGR and CGD can be held to another (e.g. high) level during the calibration process. In any event, update control signal UDCGS may then pulse high in response to calibration enable signal CEN going low, and the appropriate post-calibration states can then be set and maintained on control signals CGR and CGD via NAND-gate 518 and NOR-gates 516 and 520.

The particular logic employed as to converting the phase 1 and phase 2 calibration test results into updated states on control signals CGR and CGD can vary depending on the types of dual-gate transistors (e.g., NMOS versus PMOS) that are used, as well as the data inputs to the amplifier or other circuit under test for the given phase. In one particular example, Table 1 below shows example states of the amplifier due to various calibration interrogations for the two phases of the calibration sequence, and resulting considerations for control signals CGR and CGD.

TABLE 1

| Calibration Phase | DI | REFADJ | DO | CGR Considerations | CGD Considerations |
|---|---|---|---|---|---|
| 1 | 0 | +VADJ | 0 | Default | Default |
|  |  |  | 1 | Increase CGR | Hold |
| 2 | 0 | −VADJ | 0 | Hold | Increase CGD |
|  |  |  | 1 | Default | Default |

Thus, the "default" considerations may represent cases where the expected result in reading sense amplifier 102 has occurred. Since the circuit operated according to expectations, control signals CGR and CGD could remain the same post calibration sequence. However, control signal CGR and CGD could also be changed such that the margin of the amplification of corresponding data is increased, thereby still presenting the expected result for these cases, and possibly improving or otherwise modifying other results. Also, the "hold" consideration can generally be with respect to the corresponding CGR/CGD consideration. Thus, an increase CGR consideration and a hold CGD consideration could alternatively be presented as a hold CGR consideration and a decrease CGD consideration. Thus, many possible variations exist as to CGR/CGD considerations and possible interpretations in particular embodiments.

In any event, the CGR and CGD considerations found in Table 1 above can then be converted to control signal CGR and CGD settings to be maintained after the calibration sequence is complete. Example mappings of CGR/CGD considerations to associated control signal settings are shown below in Table 2. In this particular example, the default/hold states may be low level states because CGR and CGD are held low when calibration enable signal CEN is active. As discussed above, other interpretations as well as other values of the default/hold states may also be allowed in particular embodiments, as Tables 1 and 2 merely represent one particular set of examples of calibration result and associated control signal manipulation.

TABLE 2

| DO Phase 1 Result | DO Phase 2 Result | Updated CGR Settings | Updated CGD Settings |
|---|---|---|---|
| 0 | 0 | 0 | 1 |
| 0 | 1 | 0 | 0 |
| 1 | 0 | 0 | 0 |
| 1 | 1 | 1 | 0 |

Referring now to FIG. 6, shown is a waveform diagram of an example calibration control operation, in accordance with embodiments of the present invention. Waveforms 600 can include calibration enable command being high on a positive edge of CLK in order to activate the calibration sequence. Count signals CT[2:0] can cycle from 000 to 111 as shown to define the various cycles that are part of the calibration sequence. In cycle CT[2:0]=000, phase calibration enable signal CENP1 can go high, which can also initiate a change in the adjusted reference level (REFADJ) to be VADJ (e.g., about 200 mV) greater than the nominal reference level. In cycle CT[2:0]=001, the sense amplifier can be enabled for the calibration sequence by SENCB going low. Thus, signal development based on a difference between data input DI and the adjusted reference level can begin upon activation of the calibration sense amplifier enable signal.

In cycle CT[2:0]=010, enable latch control signal ELP1 can pulse high in order to allow for the phase 1 calibration result to be captured. Thus, the time from SENCB going low until ELP1 goes high should be sufficient to allow for suitable signal development on the sense amplifier. In cycle CT[2:0]=011, phase calibration enable signal CENP1 can go low, which can initiate a change in adjusted reference level REFADJ back to the nominal reference level, as well as disabling of the sense amplifier by SENCB going high. This can complete the first phase of the calibration sequence. In cycle CT[2:0]=100, the second phase of the calibration sequence can begin with phase calibration enable signal CENP2 going high, and essentially the process can be completed for the other side of the sense amplifier or other circuitry under consideration. This can also initiate a change in the adjusted reference level (REFADJ) to be VADJ less than the nominal reference level.

In cycle CT[2:0]=101, the sense amplifier can again be enabled for the calibration sequence by SENCB going low. In cycle CT[2:0]=110, enable latch control signal ELP2 can pulse high in order to allow for the phase 2 calibration result to be captured. Thus, the time from SENCB going low until ELP2 goes high should be sufficient to allow for suitable signal development on the sense amplifier. While in this case these timings are the same, depending on the particular circuit under consideration and the purpose of performing the calibration sequence, the timing between SENCB going low until ELP1 versus ELP2 going high may be different. In cycle CT[2:0]=111, phase calibration enable signal CENP2 can go low, which can initiate a change in adjusted reference level REFADJ back to the nominal reference level, and disabling of the sense amplifier by SENCB going high. This can substantially complete the second phase of the calibration sequence. In addition, update control signal UDCGS can pulse high to allow updating of control signals CGR and CGD when the calibration sequence is completed.

In various embodiments, a reference level utilised in an amplifier with dual-gate transistors can be adjusted during a calibration sequence, and may be substantially unchanged outside of the calibration sequence. In one embodiment, a semiconductor device can include: (i) a first transmission gate coupled between a reference voltage and an adjusted reference voltage, and being off during a calibration sequence, where the calibration sequence comprises first and second phases; (ii) a digital-to-analog converter (DAC) configured to provide an adjustment voltage; (iii) second and third transmission gates coupled between the reference voltage and the adjusted reference voltage, and being on during the first phase and off during the second phase; and (iv) fourth and fifth transmission gates coupled between the reference voltage and the adjusted reference voltage, and being off during the first phase and on during the second phase.

Figure 7:
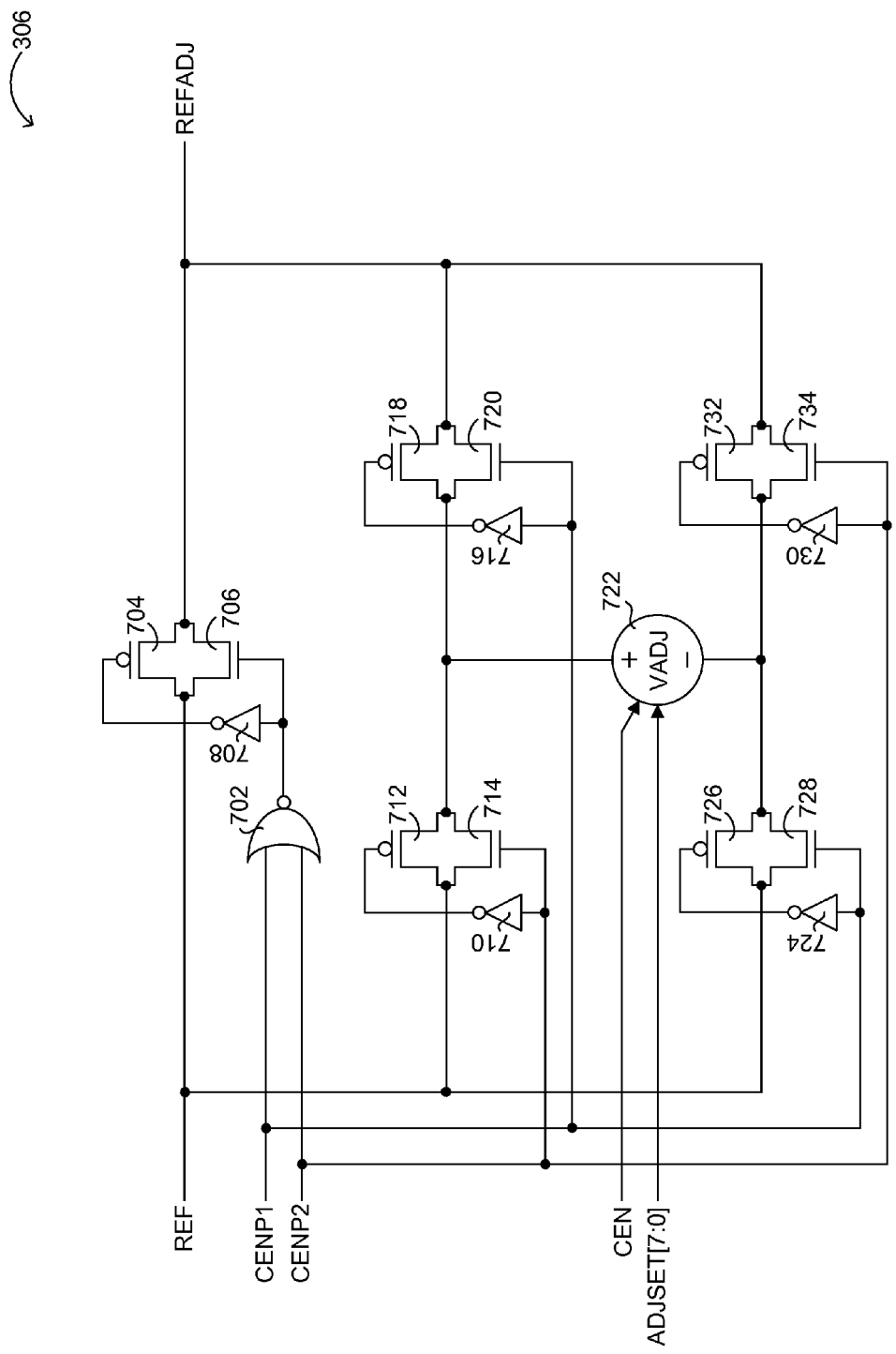
FIG. 7 is a schematic block diagram showing an example reference level adjustor, in accordance with embodiments of the present invention.

Referring now to FIG. 7, shown is a schematic block diagram of an example reference level adjustor, in accordance with embodiments of the present invention. Reference level adjustor 306 can include various transmission gates that can allow one of a nominal reference level (REF), REF+VADJ, or REF−VADJ, to pass as adjusted reference level REFADJ, depending on the status of the calibration sequence. When neither of phase 1 or phase 2 calibration enable signal is active, transmission gate 704/706 can be turned on via the control of NOR-gate 702 and inverter 708. During this time, nominal reference level REF can pass through as adjusted reference level REFADJ, such as during normal or non-calibration operation. In other cases, such as when the data input as opposed to the reference level is to be altered during the calibration sequence, or other external controls allow for manipulation of one or both of the signal gate inputs under consideration, this circuit may be bypassed.

During phase 1 of the calibration sequence when CENP1 is active, transmission gates 718/720 (with inverter 716 control) and 726/728 (with inverter 724 control) can be turned on to allow VADJ voltage source 722 to be added to nominal reference level REF. In this way, the sense amplifier can be tested with an increased input value on the reference side in order to test the amplifier behavior, such as for possible input offset, or other circuit performance aspects. Similarly, during phase 2 of the calibration sequence when CENP2 is active, transmission gates 712/714 (with inverter 710 control) and 732/734 (with inverter 730 control) can be turned on to allow VADJ voltage source 722 to be subtracted from nominal reference level REF. In this way, the sense amplifier can be tested with a decreased input value on the reference side in order to test the amplifier behavior, such as for possible input offset or other circuit performance aspects on the "other" side, or from another expected output.

Figure 8:
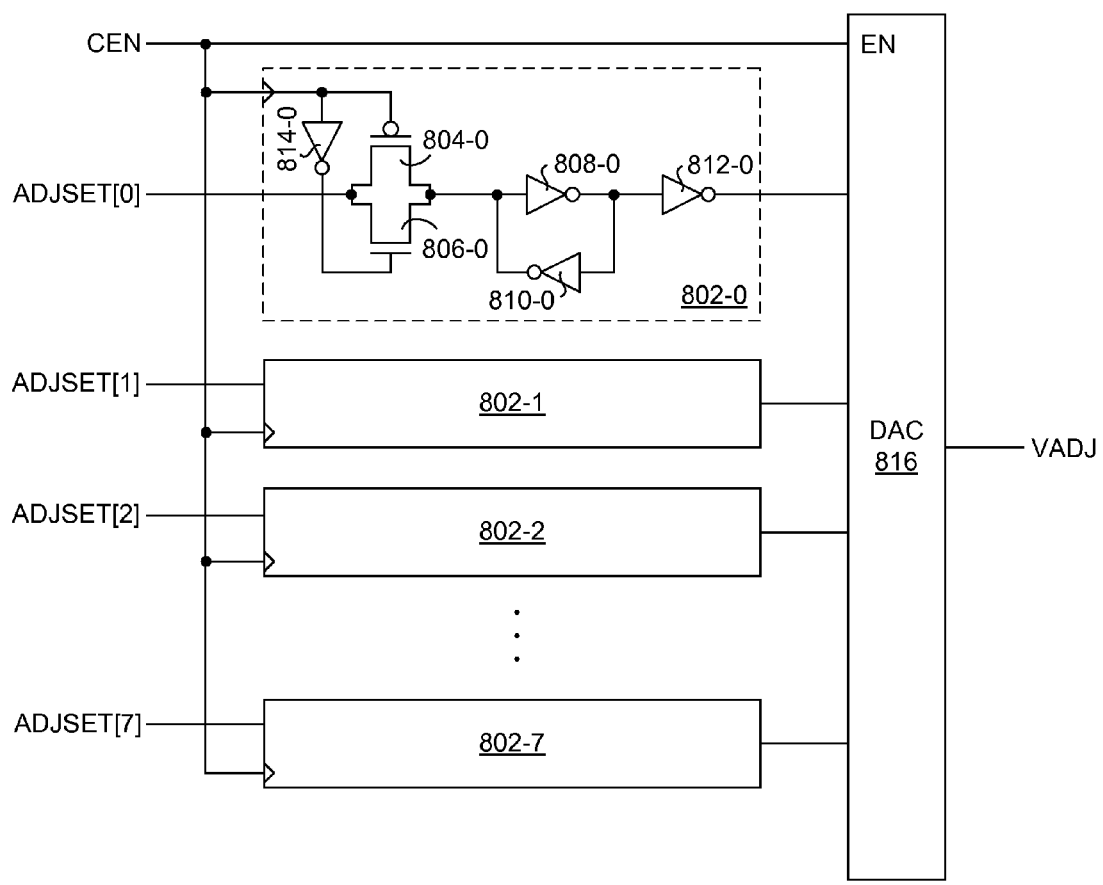
FIG. 8 is a schematic block diagram showing an example adjustment voltage generator, in accordance with embodiments of the present invention.

Referring now to FIG. 8, shown is a schematic block diagram of an example adjustment voltage generator, in accordance with embodiments of the present invention. Example adjustment voltage generator 722 can include digital to analog converter (DAC) 816, which can set adjusted voltage value VADJ based on captured adjustment setting inputs ADJSET[7:0]. Thus in this particular example, DAC 816 can be an 8-bit DAC. Adjustment settings ADJSET can be captured on a bit by bit basis via latch circuits 802 (e.g., 802-0, 802-1, 802-2, . . . 802-7). As discussed above, the adjustment settings can be dynamically input to the device, and the settings can change at any time outside of the calibration sequence (e.g., when calibration enable is low). Further, default values can be used for these adjustment settings, and any suitable external pins mapped to such adjustment setting signals ADJSET[7:0] for changing the values, can be employed.

As shown in latch circuit 802-0, calibration enable signal CEN when low can allow the transmission gate to open. Thus, when CEN is low, PMOS transistor 804-0 can be turned on, and NMOS transistor 806-0 can also be turned on via inverter 814-0, to allow ADJSET[0] to be captured in latch 802-0. Once calibration enable signal CEN goes high to turn off the transmission gate, this adjustment setting bit can be held via inverters 808-0 and 810-0, and may be buffered via inverter 812-0 to be supplied to DAC 816. In addition, DAC 816 can be enabled only during CEN activation times (via input EN), in order to save power. Further, any suitable range of values (e.g., 25 mV, 50 mV, . . . 200 mV, etc.) can be supported via DAC 816. Also, the particular range or choices of adjustment voltage VADJ can be set (e.g., via the adjustment settings signals) based on the particular amplifier or circuit under consideration, as well as based on process and operating voltage, among other factors.

In certain embodiments, a calibration sequence can be utilised to determine circuit results from a circuit including dual-gate transistors, and to adjust control gates to more closely coincide with expected results. In one embodiment, a method of controlling dual-gate transistors can include: (i) activating a calibration sequence having first and second phases in response to a calibration command; (ii) during the first phase, increasing a first data input at a signal gate of a first dual-gate transistor by an adjustment voltage, and storing a first result; (iii) during the second phase, decreasing the first data input, and storing a second result; and (iv) using the first and second results to set first and second control signals, wherein the first control signal is coupled to a control gate of the first dual-gate transistor, and the second control signal is coupled to a control gate of the second dual-gate transistor.

Figure 9:
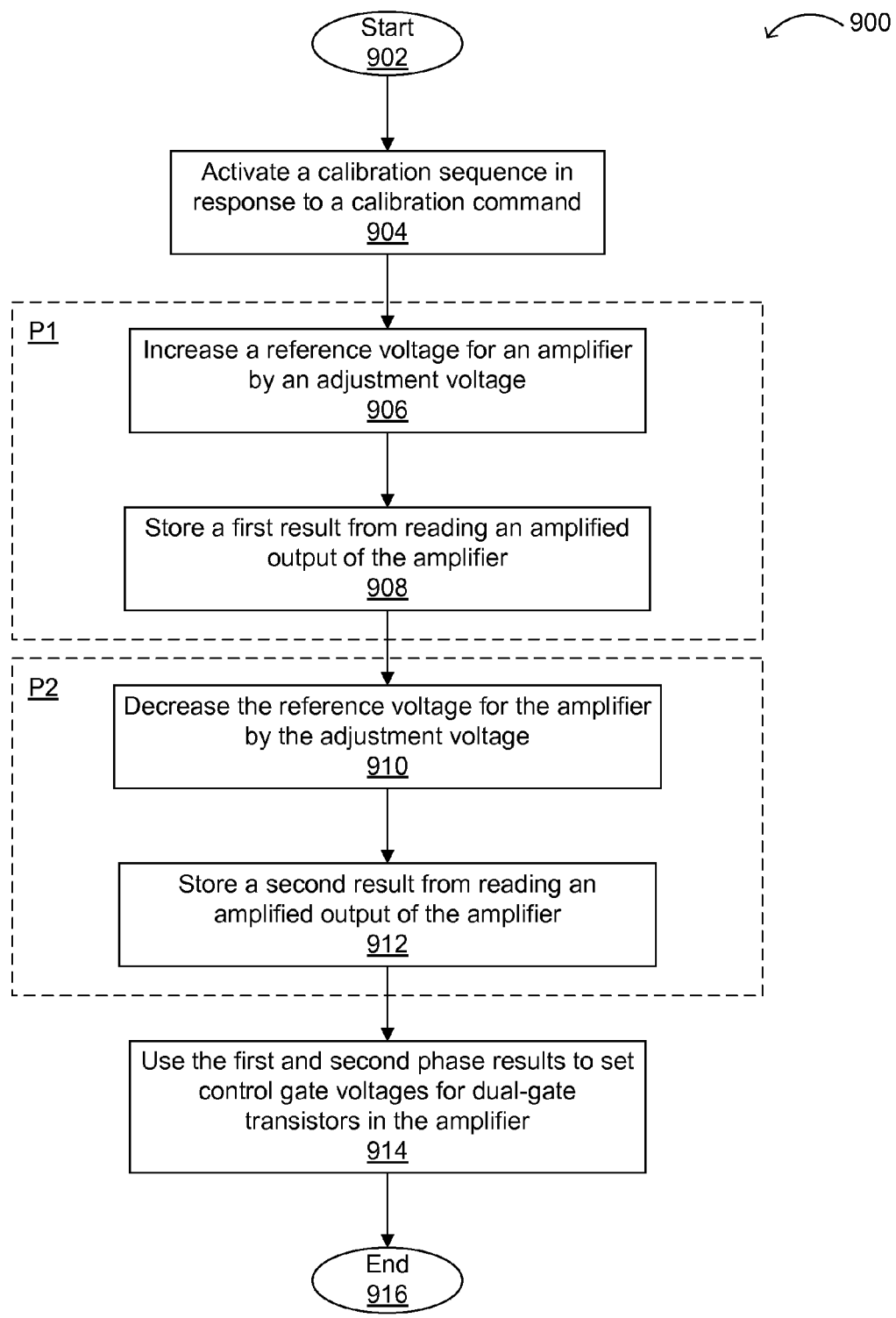
FIG. 9 is a flow diagram showing an example method of controlling dual-gate transistors, in accordance with embodiments of the present invention.

Referring now to FIG. 9, shown is a flow diagram of an example method 900 of controlling dual-gate transistors, in accordance with embodiments of the present invention. The flow can begin at 902, and a calibration sequence can be activated in response to a calibration command at 904. For example, calibration enable command/signal CENCMD can be latched on a rising edge of CLK by D-type flip-flop 404 to activate the calibration sequence. As discussed above, the calibration sequence can generally include two phases, shown as the dashed boxes P1 to represent phase 1, and P2 to represent phase 2. Of course, the calibration sequence could be organized into other portions, ordering of portions/phases, or other subsets of operation.

In the examples described herein, in the first phase at 906, a reference voltage for a differential or sense amplifier (or other circuitry under consideration) can be increased by an adjustment voltage. For example, adjustment voltage VADJ can be added to nominal reference level REF (see, e.g., reference level adjustor 306) in order to test one "side" or expected output of the amplifier or circuit. At 908, a first result from reading an amplified output of the amplifier can be stored. For example, latches 502-0/502-1 in FIG. 5 can be used to store this first phase calibration result, in order to apply a predetermined mapping to generate updated control signal voltages.

In the second phase at 910, a reference voltage for a differential or sense amplifier can be decreased by an adjustment voltage. For example, adjustment voltage VADJ can be subtracted from nominal reference level REF (see, e.g., reference level adjustor 306) in order to test the other side or expected output of the amplifier. At 912, a second result from reading and amplified output of the amplifier can be stored. For example, latches 502-2/502-3 in FIG. 5 can be used to store this first phase calibration result. At 914, the first and second phase results can be used (e.g., via logic circuits corresponding to a predetermined mapping) to set control gate voltages for dual-gate transistors in the amplifier (or other circuit under consideration), and the flow can complete at 916. In one example of predetermined mapping, as shown above in Tables 1 and 2, the first and second phase results can be mapped to control signals CGR and CGD.

The flow can also include repetitions of the sequence, such as for multiple memory cells or memory arrays, or multiple instances of any appropriate circuitry under consideration, whereby suitable control signal settings can occur for each, or a subset of, the multiple circuit instances. As will be discussed in more detail below, a memory array including a plurality of memory cells can be tested using a calibration sequence as described herein, and this may be repeated for all cells in an array, for multiple arrays, and/or multiple circuit instances. For example, such calibration sequence(s) can occur as part of a power up sequence, or another initialization sequence, of a semiconductor device. As another example, such calibration sequence(s) can occur as part of a test/characterization sequence prior to sending a semiconductor device to a customer. As yet another example, such calibration sequence(s) can be initiated by a customer as part of a field-based optimization procedure.

In particular embodiments, a semiconductor memory device can include a memory array with amplifiers that include dual-gate transistors, as well as associated calibration circuitry. In one embodiment, a semiconductor memory device can include: (i) a memory array comprising a plurality of data amplifiers, wherein each of the data amplifiers comprises first and second dual-gate transistors; (ii) a plurality of register pairs coupled to the plurality of data amplifiers, wherein each of the register pairs comprises a first register configured to store a first control signal for a control gate of the first dual-gate transistor, and a second register configured to store a second control signal for a control gate of the second dual-gate transistor; and (iii) a calibration control circuit configured to generate the first and second control signals for a selected of the plurality of data amplifiers.

Figure 10:
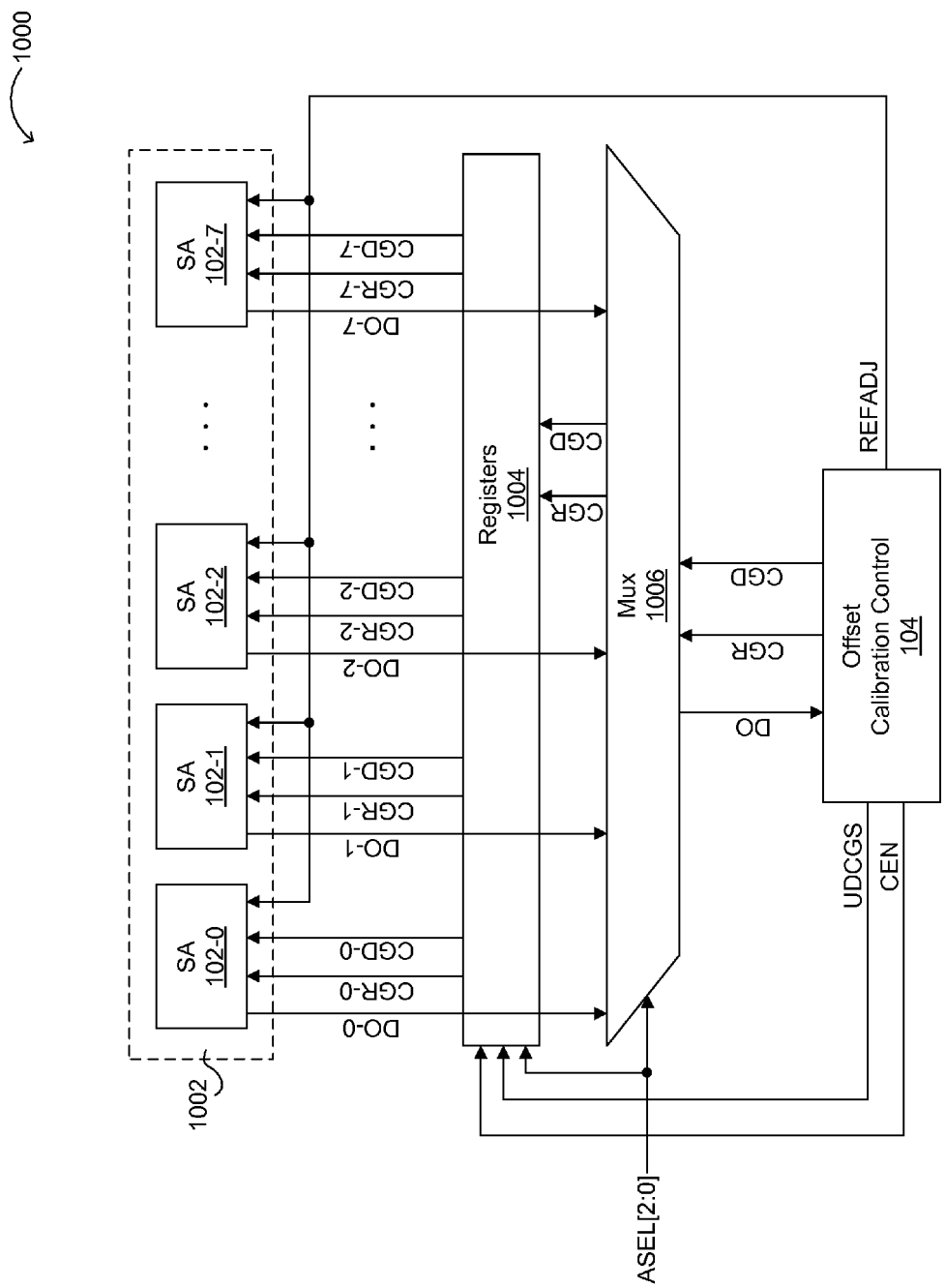
FIG. 10 is a schematic block diagram showing an example calibration control arrangement for a memory array, in accordance with embodiments of the present invention.

Referring now to FIG. 10, shown is a schematic block diagram of an example calibration control arrangement for a memory array, in accordance with embodiments of the present invention. Example memory array and calibration control 1000 can include memory array 1002, registers 1004, multiplexer 1006, and offset calibration control 104. Memory array 1002 can include any type of memory cell (e.g., volatile, non-volatile, resistive, dynamic, etc.), and sense amplifiers 102 (e.g., 102-0, 102-1, 102-2, . . . 102-7). Shared data lines (not shown) can connect between memory cells or other amplifiers and sense amplifiers 102, and sense amplifiers 102 may be considered data or I/O amplifiers, whereby the data input to sense amplifiers 102 can be from any suitable memory configuration or other circuitry.

The calibration sequence as described above can be performed for one or more of amplifiers 102. For example, address select signals ASEL[2:0] can be used to select one of sense amplifiers 102 for calibration, and then the sequence can be formed for an adjacent of sense amplifiers 102, and so on. Alternatively, a certain sense amplifier can be selected for calibration due to other test or characterization results, and in this case the calibration sequence as described herein can be a supplemental process to an underlying test/characterization process. In some cases, input offset can occur on one or some subset of the sense amplifiers, and this can be determined via other testing/characterization. As a result, the affected sense amplifiers can be selected (e.g., via ASEL[2:0]) for calibration and adjustment of the control gates on dual-gate transistors of interest, in order to improve or otherwise modify the performance of that particular sense amplifier(s). As another example, the calibration sequence can be performed on one or some subset of sense amplifiers 102 based on other test/characterization results, such as reduced margins for reading a given data state, and the cause can be a reason other than input offset. Thus, the calibration sequence as described herein is amenable to a variety of test, characterization, and/or circuit aspect or performance modifications.

Thus, address select (e.g., column address select) signals can be received by registers 1004 and multiplexer 1006, and may be used to select the appropriate sense amplifier 102 for a given calibration sequence. Thus, each of data outs (e.g., DO-0, DO-1, DO-2, . . . DO-7) from sense amplifiers 102 can be provided to multiplexer 1006 for selection to a single data out provided to offset calibration control 104. The result of the calibration sequence can then be provided from offset calibration control 104 to registers 1004. Registers 1004 can store control signal CGR/CGD information for the appropriate sense amplifier. If no calibration is performed on a given sense amplifier, or if no adjustment is needed based on the results of the calibration sequence, the control signals CGR/CGD corresponding to a given sense amplifier 102 can remain in their default state. In this way, calibration circuitry can be shared among a number of circuits (e.g., sense amplifiers) under consideration for control gate modification.

Figure 11:
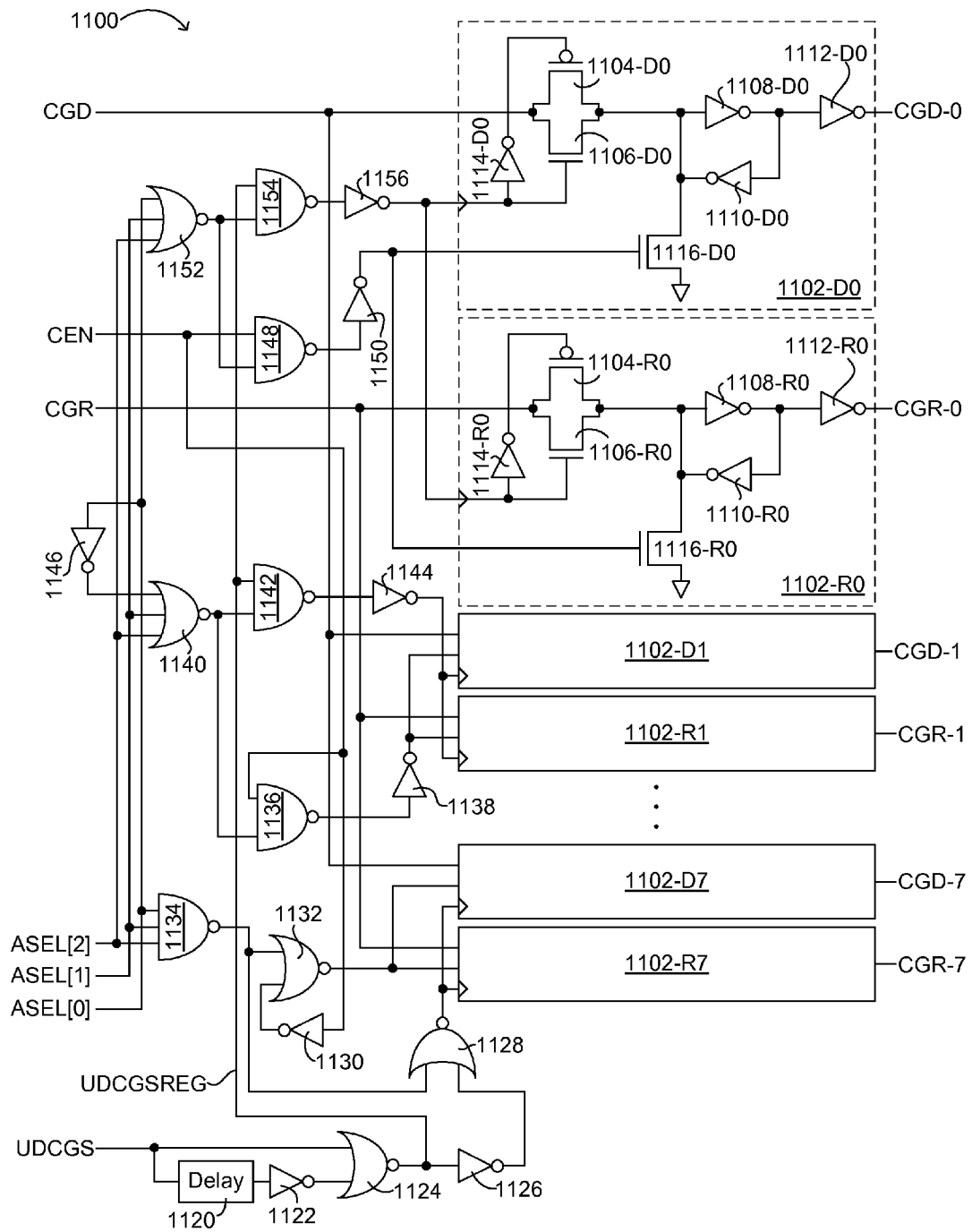
FIG. 11 is a schematic block diagram showing an example of register and multiplexer circuitry for calibration control for a memory array, in accordance with embodiments of the present invention.

Referring now to FIG. 11, shown is a schematic block diagram of an example of register and multiplexer circuitry for calibration control for a memory array, in accordance with embodiments of the present invention. Example 1100 can include circuitry found in registers 1004 and multiplexer 1006. Registers 1004 can include a pair of latches 1102 to store the control signals CGR/CGD corresponding to each amplifier 102, or other circuit under consideration. In some cases, the particular circuit under consideration may have only one dual-gate transistor with a control gate to be modified as part of the calibration sequence. In these cases, instead of a pair of latches 1102, only a single latch may be used corresponding to the given circuit under consideration.

As shown in the latch circuit 1102-D0 when the appropriate address signals (e.g., 000) and timing signals match via NOR-gate 1152, NAND-gate 1154, and inverter 1156, the transmission gate can open. Thus, when the output of inverter 1156 is high, NMOS transistor 1106-D0 can be turned on, and PMOS transistor 1104-D0 can also be turned on via inverter 1114-D0, to allow CGD to be captured in latch 1102-D0. Once the output of inverter 1156 goes low to turn off the transmission gate, this control signal can be held via inverters 1108-D0 and 1110-D0, and may be buffered via inverter 1112-D0 such that control signal CGD-0 can be provided to corresponding sense amplifier 102-0. In addition, latch 1102-D0 can be reset low via NMOS transistor 1116-D0 when the address signals match via NOR-gate 1152 and calibration enable signal CEN is active, as determined via NAND-gate 1148 and inverter 1150, in order to set the local control signal CGD-0 as low during the calibration process. Alternatively, a pull-up transistor can be employed in place of transistor 1116-D0 if the default state of the corresponding local control gate signal is to be high.

Similarly, as shown in latch circuit 1102-R0 when the appropriate address signals (e.g., 000) and timing signals match via NOR-gate 1152, NAND-gate 1154, and inverter 1156, the transmission gate can open. Thus, when the output of inverter 1156 is high, NMOS transistor 1106-R0 can also be turned on, and PMOS transistor 1104-R0 can also be turned on via inverter 1114-R0, to allow CGR to be captured in latch 1102-R0. Once the output of inverter 1156 goes low to turn off the transmission gate, this control signal can be held via inverters 1108-R0 and 1110-R0, and may be buffered via inverter 1112-R0 such that control signal CGR-0 can be provided to corresponding sense amplifier 102-0. In addition, latch 1102-R0 can be reset low via NMOS transistor 1116-R0 when the address signals match via NOR-gate 1152 and calibration enable signal CEN is active, as determined via NAND-gate 1148 and inverter 1150, in order to set the local control signal CGR-0 as low during the calibration process.

Similar selections and controls can occur for latch pair 1102-D1 and 1102-R1 that correspond to control signals CGD-1 and CGR-1, respectively, and which also correspond to sense amplifier 102-1. The transmission gates in latches 1102-D1 and 1102-R1 can be open when the appropriate address signals (e.g., 001) and timing signals match via inverter 1146, NOR-gate 1140, NAND-gate 1142, and inverter 1144. In addition, latches 1102-D1 and 1102-R1 can be reset low when the address signals match via inverter 1146 and NOR-gate 1140, and calibration enable signal CEN is active, as determined via NAND-gate 1136 and inverter 1138, in order to set the local control signals CGD-1 and CGR-1 as low during the calibration process.

Similar selections and controls can occur for the other latches in registers 1004, including latch pair 1102-D7 and 1102-R7 that correspond to control signals CGD-7 and CGR-7, respectively, and which also correspond to sense amplifier 102-7. The transmission gates in latches 1102-D7 and 1102-R7 can be open when the appropriate address signals (e.g., 111) and timing signals match via NAND-gate 1134, inverter 1126, and NOR-gate 1128. In addition, latches 1102-D7 and 1102-R7 can be reset low when the address signals match via NAND-gate 1134, and calibration enable signal CEN is active, as determined via NOR-gate 1132 and inverter 1130, in order to set the local control signals CGD-7 and CGR-7 as a low default state during the calibration process, as discussed above.

The register update control signal UDCGSREG can be generated as a one-shot or pulse signal upon a falling edge of update control signal UDCGS. This pulse signal can be a duration substantially of delay circuit 1120, an output of which can be inverted via inverter 1122, and input to NOR-gate 1124. NOR-gate 1124 can thus provide a high going pulse signal upon a high to low transition of update control signal UDCGS. In this way, the control signals as provided to registers 1004 can be updated after the global CGR and CGD control signals have been updated via offset calibration control 104. Thus, the local control signals for sense amplifiers 102 can be updated after the global control signals coming from shared calibration circuit 104 have been updated.

Particular embodiments are suitable for a wide variety of circuits under consideration for calibration (e.g., differential amplifiers, sense amplifiers, input receivers, etc.), and also to a wide variety of input combinations for such circuitry under consideration. As will be discussed in the examples below, input receivers (e.g., to receive a value from an external pin), including purely differential input receivers, low voltage swing terminated logic (LVSTL), etc., can also be accommodated in certain embodiments. Of course, other circuitry, including circuits that may have only one dual-gate transistor with a control gate in order to modify circuit operation as a result of the calibration sequence, can also be accommodated.

Figure 12:
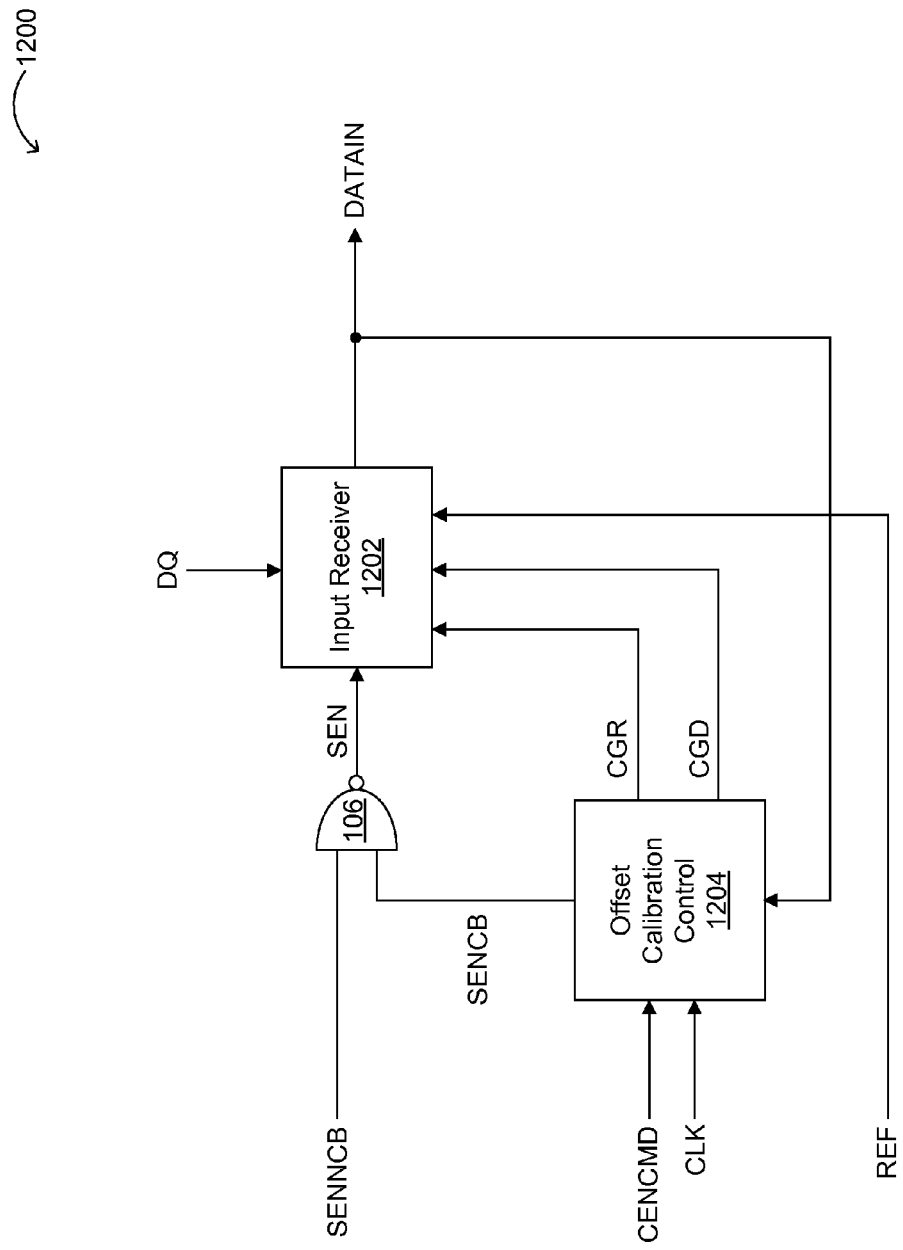
FIG. 12 is a schematic block diagram showing an example amplifier and calibration control arrangement for an input receiver, in accordance with embodiments of the present invention.

Referring now to FIG. 12, shown is a schematic block diagram of an example amplifier and calibration control arrangement for an input receiver, in accordance with embodiments of the present invention. In example 1200, input receiver 1202 can receive data input (e.g., I/O data or DQ) from an external connection to the chip. Offset calibration control 1204 can receive calibration enable command signal CENCMD and clock signal CLK, and DATAIN as output from input receiver 1202. For example, reference voltage level REF can be directly applied to input receiver 1202. Thus, additional adjustment setting signals may not be needed in this case because reference level REF may be an input to the device that can also be adjusted through external control as part of the calibration process. Offset calibration control 1204 can provide control gate signals (CGR, CGD) and non-calibration sense amplifier enable signal SENNCB can be input to NAND-gate 106 along with calibration sequence sense amplifier enable signal SENCB, such that sense amplifier enable signal SEN can be output from NAND-gate 106.

This particular arrangement can be used to change characteristics of input receiver 1202 by way of control signal adjustment on one or more control gates of dual-gate transistors in input receiver 1202. Calibration control 1204 can be employed to effectively change input receiver trip points, thus adapting input receiver 1202 to different signaling characteristics on data input DQ. Thus for example, the calibration sequence as described herein can be applied to effectively modify the I/O interface of the device, even to adapt to different signaling characteristics or protocols, thereby allowing the semiconductor device to be used in a variety of applications without having different mask sets or other controls to adapt the input receiver circuitry in order to properly determine the data state of the input signal. Instead, dynamic calibration circuitry as described herein can be used to appropriately modify circuit behavior of input receiver 1202.

Figure 13:
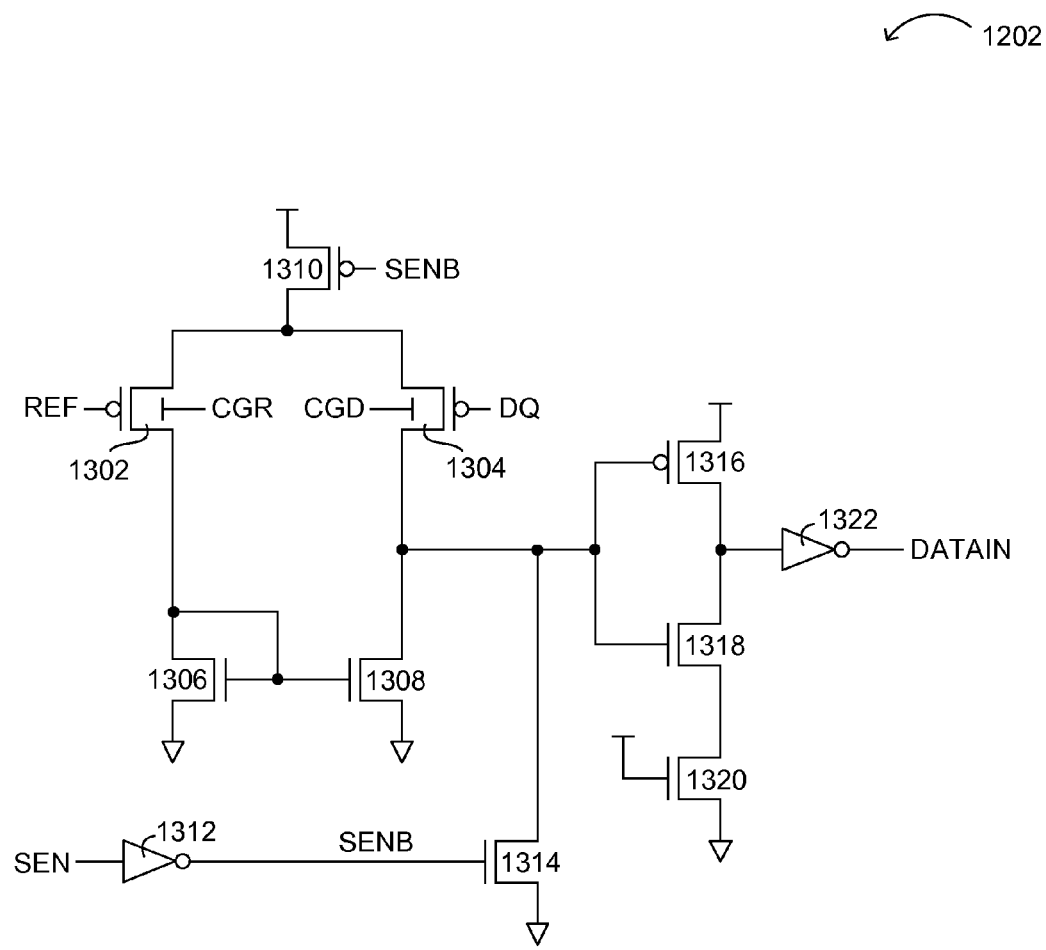
FIG. 13 is a schematic block diagram showing an example input receiver with dual-gate transistors, in accordance with embodiments of the present invention.

Referring now to FIG. 13, shown is a schematic block diagram of an example input receiver with dual-gate transistors, in accordance with embodiments of the present invention. Input receiver 1202 can include dual-gate (e.g., FinFET) transistors 1302 and 1304. Dual-gate transistor 1302 can receive reference level REF at a signal gate, and control signal CGR at a control gate. Also, dual-gate transistor 1304 can receive I/O data DQ at a signal gate, and control signal CGD at a control gate. NMOS transistors 1306 and 1308 can form the load transistor portion of the input receiver. Also, the input receiver can be enabled via SEN provided to inverter 1312, with an output connected to the gates of PMOS transistor 1310 and NMOS transistor 1314.

A ratioed inverter stage can include PMOS transistor 1316, and NMOS transistors 1318 and 1320. Inverter 1322 can then be utilized to provide the input receiver output, DATAIN. In the ratioed inverter stage, one or more of these devices could alternatively or additionally be implemented as independently controlled dual-gate transistors whereby their control gates can be modified by way of the calibration circuitry. This is another way that input receiver 1202 trip points could be modified in order to adjust the input receiver to different input signal characteristics. Particular embodiments may also support single ended input receivers in much the same fashion. In such cases where a single ended or non-differential amplifier is to be adjusted, the phase 1 and phase 2 portions of the calibration sequence can be modified to include only a single phase, or to test different circuit aspects or expected outcomes in the predefined phases.

Figure 14:
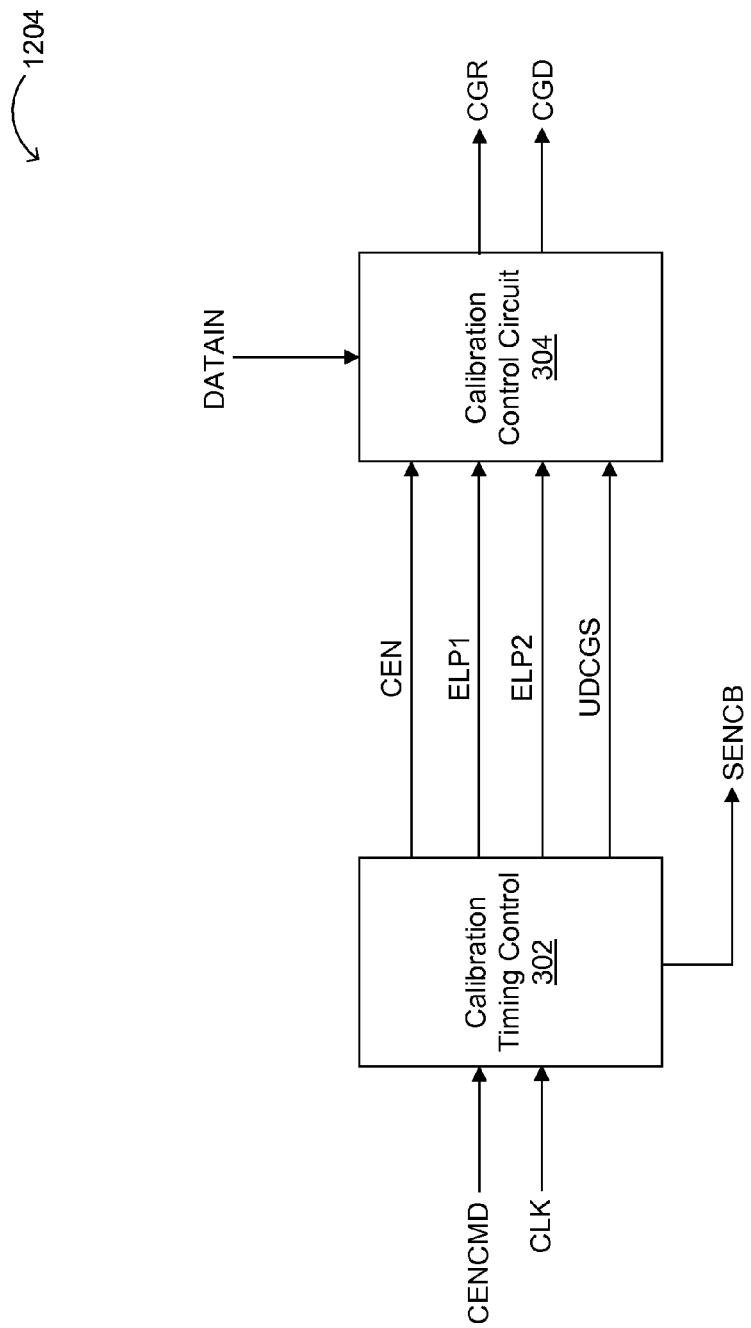
FIG. 14 is a schematic block diagram showing an example calibration controller for an input receiver, in accordance with embodiments of the present invention.

Referring now to FIG. 14, shown is a schematic block diagram of an example calibration controller for an input receiver, in accordance with embodiments of the present invention. Offset calibration control 1204 can include calibration timing control 302 and calibration control circuit 304. As discussed above, calibration timing control 302 can generate various timing signals utilized by other circuits in the calibration sequence or process. Calibration timing control 302 can receive calibration enable command signal CENCMD and clock signal CLK, and may generate calibration enable signal CEN, phase 1 enable latch control signal ELP1, phase 2 enable latch control signal ELP2, update control gate signal pulse UDCGS, and calibration sequence sense amplifier enable signal SENCB.

Calibration control circuit 304 can receive calibration enable signal CEN, phase 1 enable latch control signal ELP1, phase 2 enable latch control signal ELP2, update control gate signal pulse UDCGS, and DATAIN from input receiver 1202, and may generate control signals CGR and CGD for the control gates of transistors 1302 and 1304 in input receiver 1202. In this case, reference level REF can be controlled (e.g., externally) to be an increased or decreased voltage relative to reference level, in order to effectively test both sides of input receiver 1202. As discussed above, modifications to this example circuitry can be made in order to support a single phase and/or to test different circuit aspects or expected outcomes, such as in single ended (as opposed to differential) signaling or amplification.

Figure 15:
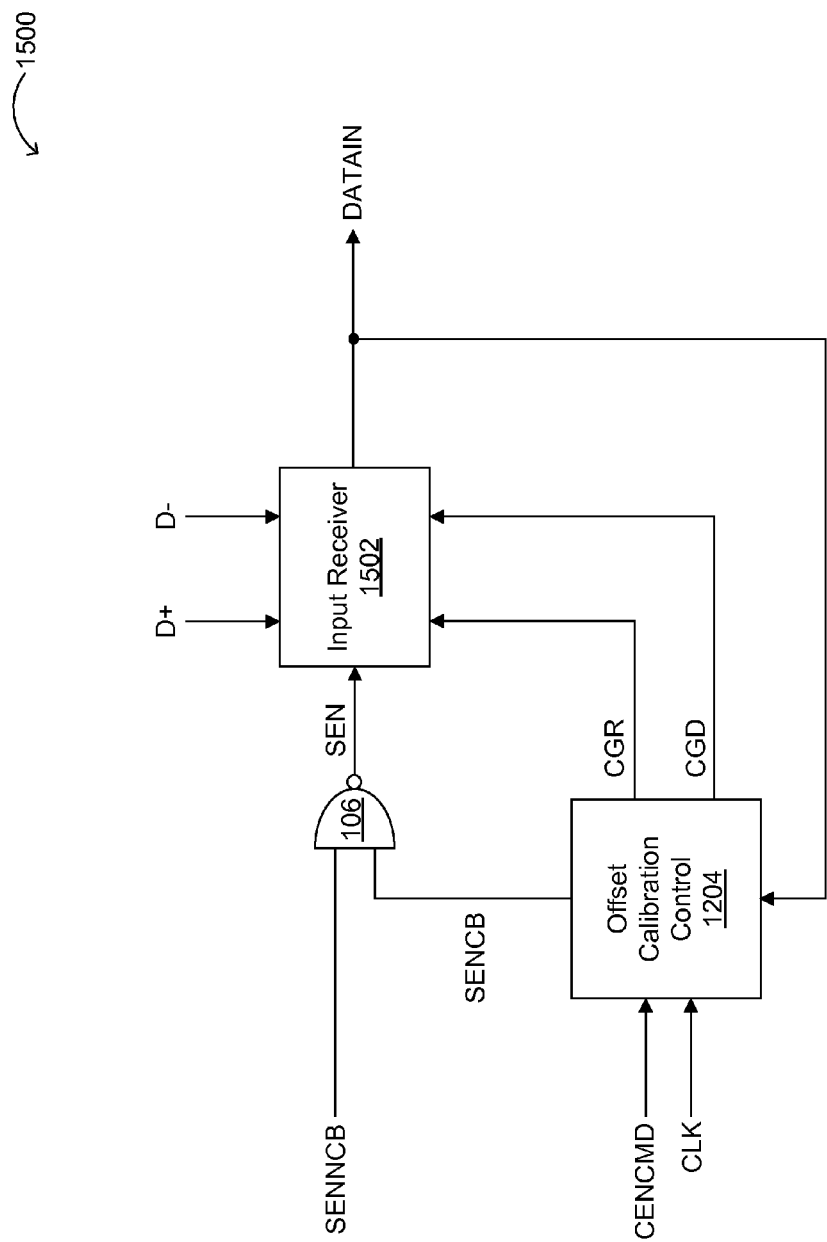
FIG. 15 is a schematic block diagram showing an example amplifier and calibration control arrangement for an input receiver with differential inputs, in accordance with embodiments of the present invention.

Referring now to FIG. 15, shown is a schematic block diagram of an example amplifier and calibration control arrangement for an input receiver with differential inputs, in accordance with embodiments of the present invention. In example 1500, input receiver 1502 can receive differential input data (e.g., D+ and D−), such as from an external chip connection. As discussed above, offset calibration control 1204 can receive calibration enable command signal CENCMD and clock signal CLK, and DATAIN as output from input receiver 1502. In this particular example, no reference level need be utilised, because the data is purely differential, and adjustments can be made based on these external signals. As such, additional adjustment setting signals may not be needed in this case because the input data D+/D− can be adjusted through external control as part of the calibration process.

Figure 16:
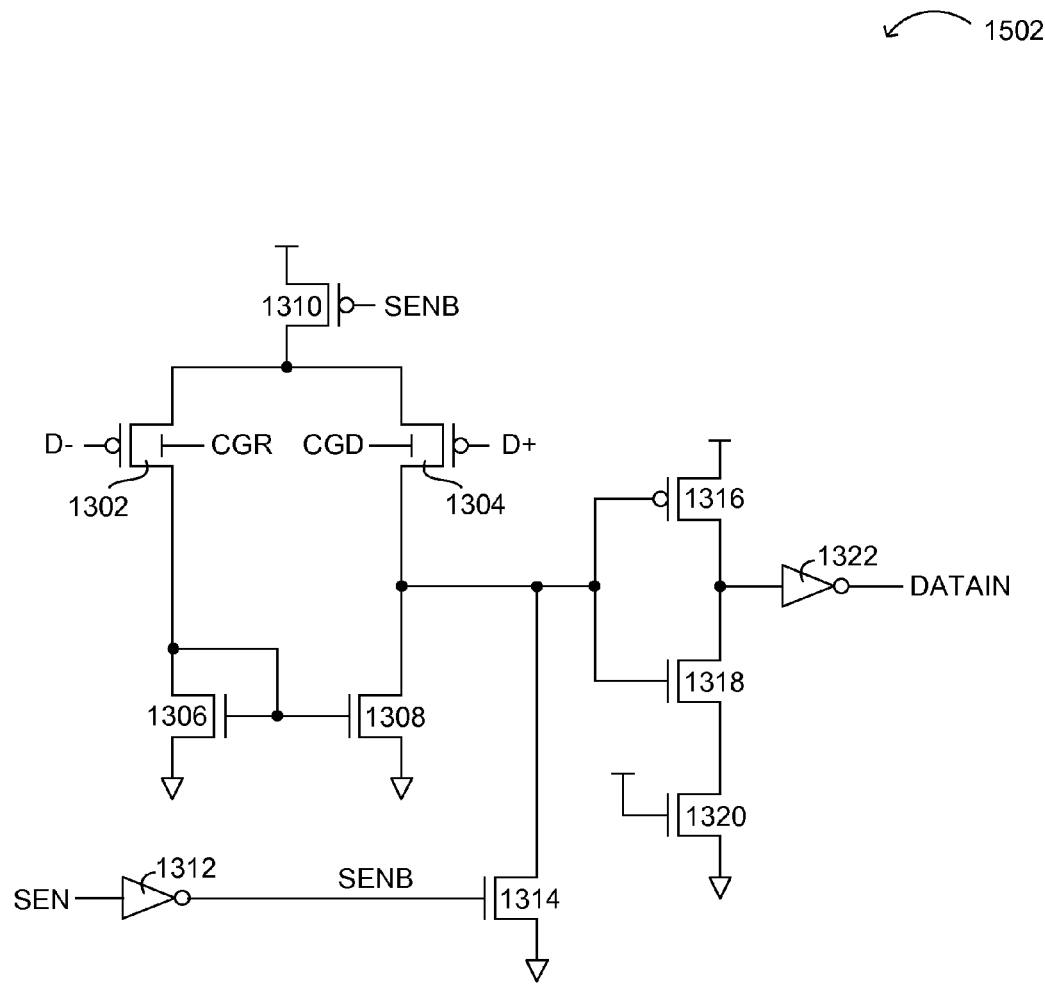
FIG. 16 is a schematic block diagram showing an example input receiver with dual-gate transistors and differential inputs, in accordance with embodiments of the present invention.

Referring now to FIG. 16, shown is a schematic block diagram of an example input receiver with dual-gate transistors and differential inputs, in accordance with embodiments of the present invention. Similar to the example discussed above, input receiver 1502 can include dual-gate (e.g., FinFET) transistors 1302 and 1304. However, in this case the inputs may be purely differential, and thus the differential inputs may be sensed with respect to each other, as opposed one being sensed relative to a reference voltage level. Dual-gate transistor 1302 can receive differential input D− at a signal gate, and control signal CGR at a control gate. Also, dual-gate transistor 1304 can receive differential input D+ at a signal gate, and control signal CGD at a control gate. NMOS transistors 1306 and 1308 can form the load transistor portion of the input receiver. Also, the input receiver can be enabled via SEN provided to inverter 1312, with an output connected to the gates of PMOS transistor 1310 and NMOS transistor 1314. A ratio at inverter stage can include PMOS transistor 1316, and NMOS transistors 1318 and 1320. Inverter 1322 can then be utilised to provide the input receiver output, DATAIN.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilise the invention and various embodiments with various modifications as are suited to the particular use contemplated. It is intended that the scope of the invention be defined by the claims appended hereto and their equivalents.

What is claimed is:

1. A semiconductor device, comprising:
a) a first transmission gate coupled between a reference voltage and an adjusted reference voltage, and being off during a calibration sequence, wherein the calibration sequence comprises first and second phases;
b) a digital-to-analog converter (DAC) configured to provide an adjustment voltage to be added to or subtracted from the reference voltage to produce the adjusted reference voltage;
c) second and third transmission gates coupled between the reference voltage and the adjusted reference voltage, and being enabled to provide the adjusted reference voltage during the first phase and disabled during the second phase; and
d) fourth and fifth transmission gates coupled between the reference voltage and the adjusted reference voltage, and being disabled during the first phase and enabled to provide the adjusted reference voltage during the second phase, wherein the adjustment voltage is received between the intervening node between the second and third transmission gates and the intervening node between the fourth and fifth transmission gates.

2. The semiconductor device of claim 1, wherein the adjusted reference voltage is equal to about the reference voltage plus the adjustment voltage during the first phase.

3. The semiconductor device of claim 1, wherein the adjusted reference voltage is equal to about the reference voltage minus the adjustment voltage during the second phase.

4. The semiconductor device of claim 1, wherein the adjusted reference voltage is equal to about the reference voltage when the calibration sequence is complete.

5. The semiconductor device of claim 1, wherein the adjusted reference voltage is coupled to a signal gate of a dual-gate transistor, and the calibration sequence is used to set a control gate of the dual-gate transistor.

6. The semiconductor device of claim 1, wherein:
a) the adjusted reference voltage is coupled to a signal gate of a first dual-gate transistor, and a control gate of the first dual-gate transistor is coupled to a first control signal; and
b) the first dual-gate transistor is coupled to a second dual-gate transistor via sources thereof, the second dual-gate transistor having a signal gate coupled to a data input, and a control gate coupled to a second control signal.

7. The semiconductor device of claim 1, wherein each of the first and second dual-gate transistors comprises a FinFET.

8. The semiconductor device of claim 1, wherein the first transmission gate is on when the calibration sequence has completed.

9. The semiconductor device of claim 1, wherein the DAC is disabled when the calibration sequence has completed.

10. The semiconductor device of claim 1, further comprising a plurality of latches coupled to the DAC, and configured to receive a plurality of adjustment setting signals.

11. The semiconductor device of claim 10, wherein the adjustment voltage is based on the plurality of adjustment setting signals.

12. The semiconductor device of claim 11, wherein the adjustment setting signals are latched in the plurality of latches in response to activation of the calibration sequence.

* * * * *